(12) United States Patent
Li et al.

(10) Patent No.: US 7,838,922 B2
(45) Date of Patent: Nov. 23, 2010

(54) ELECTRONIC DEVICE INCLUDING TRENCHES AND DISCONTINUOUS STORAGE ELEMENTS

(75) Inventors: Chi-Nan Li, Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 892 days.

(21) Appl. No.: 11/626,753

(22) Filed: Jan. 24, 2007

(65) Prior Publication Data

US 2008/0173921 A1    Jul. 24, 2008

(51) Int. Cl.
*H01L 29/94* (2006.01)

(52) U.S. Cl. .............................. 257/319; 257/E29.129; 257/E29.309

(58) Field of Classification Search ......... 257/314–334, 257/213, 288, E29.126–E29.129, E29.3–E29.309
See application file for complete search history.

(56) References Cited

U.S. PATENT DOCUMENTS

| | | | |
|---|---|---|---|
| 4,184,207 A | 1/1980 | McElroy | |
| 4,751,558 A | 6/1988 | Kenney | |
| 4,785,337 A | 11/1988 | Kenney | |
| 4,833,094 A | 5/1989 | Kenney | |
| 4,860,070 A | 8/1989 | Arimoto et al. | |
| 5,196,722 A | 3/1993 | Bergendahl et al. | |
| 5,252,845 A | 10/1993 | Kim et al. | |
| 5,315,142 A | 5/1994 | Acovic et al. | |
| 5,411,905 A | 5/1995 | Acovic et al. | |
| 5,432,365 A | 7/1995 | Chin et al. | |
| 5,460,988 A | 10/1995 | Hong | |
| 5,567,635 A | 10/1996 | Acovic et al. | |
| 5,705,415 A | 1/1998 | Orlowski et al. | |
| 5,721,448 A | 2/1998 | Hauf et al. | |
| 5,786,612 A | 7/1998 | Otani et al. | |
| 5,801,415 A | 9/1998 | Lee et al. | |
| 5,824,580 A | 10/1998 | Hauf et al. | |
| 5,907,775 A | 5/1999 | Tseng | |
| 5,914,523 A | 6/1999 | Bashir et al. | |
| 5,923,046 A | 7/1999 | Tezuka et al. | |
| 5,969,383 A | 10/1999 | Chang et al. | |
| 5,998,263 A | 12/1999 | Sekariapuram et al. | |
| 6,060,743 A | 5/2000 | Sugiyama et al. | |
| 6,074,954 A | 6/2000 | Lill et al. | |
| 6,117,733 A | 9/2000 | Sung et al. | |

(Continued)

OTHER PUBLICATIONS

Actions on the Merits by U.S.P.T.O, as of Dec. 30, 2008, 14 pgs.

(Continued)

*Primary Examiner*—Minh-Loan T Tran
*Assistant Examiner*—Kevin Quinto

(57) ABSTRACT

An electronic device can include a substrate including a trench having a bottom and a first wall. The electronic device can also include a first gate electrode within the trench and adjacent to the first wall and overlying the bottom of the trench, a second gate electrode overlying the substrate outside of the trench, and a third gate electrode within the trench and adjacent to the first gate electrode and overlying the bottom of the trench. The electronic device can also include discontinuous storage elements including a first set of discontinuous storage elements, wherein the first set of the discontinuous storage elements lies adjacent to the first wall of the trench. Processes of forming and using the electronic device are also described.

20 Claims, 18 Drawing Sheets

U.S. PATENT DOCUMENTS

| | | | |
|---|---|---|---|
| 6,121,148 A | 9/2000 | Bashir et al. | |
| 6,133,601 A | 10/2000 | Watanabe | |
| 6,172,905 B1 | 1/2001 | White et al. | |
| 6,228,706 B1 | 5/2001 | Horak et al. | |
| 6,232,632 B1 | 5/2001 | Liu | |
| 6,265,268 B1 | 7/2001 | Halliyal et al. | |
| 6,281,064 B1 | 8/2001 | Mandelman et al. | |
| 6,287,917 B1 | 9/2001 | Park et al. | |
| 6,307,782 B1 | 10/2001 | Sadd et al. | |
| 6,320,784 B1 | 11/2001 | Muralidhar et al. | |
| 6,330,184 B1 | 12/2001 | White et al. | |
| 6,344,403 B1 | 2/2002 | Madhukar et al. | |
| 6,365,452 B1 | 4/2002 | Perng et al. | |
| 6,368,916 B1 | 4/2002 | Nakagawa | |
| 6,372,617 B1 | 4/2002 | Kitamura | |
| 6,373,096 B1 | 4/2002 | Hisamune et al. | |
| 6,399,441 B1 | 6/2002 | Ogura et al. | |
| 6,433,382 B1* | 8/2002 | Orlowski et al. | 257/315 |
| 6,461,905 B1 | 10/2002 | Wang et al. | |
| 6,486,028 B1 | 11/2002 | Chang et al. | |
| 6,537,870 B1 | 3/2003 | Shen | |
| 6,544,827 B2 | 4/2003 | Abiko | |
| 6,555,427 B1 | 4/2003 | Shimizu et al. | |
| 6,559,032 B2 | 5/2003 | Gonzalez et al. | |
| 6,583,466 B2 | 6/2003 | Lin et al. | |
| 6,620,664 B2 | 9/2003 | Ma et al. | |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,687,156 B2 | 2/2004 | Kobayashi et al. | |
| 6,706,599 B1 | 3/2004 | Sadd et al. | |
| 6,709,922 B2 | 3/2004 | Ebina et al. | |
| 6,713,834 B2 | 3/2004 | Mori et al. | |
| 6,747,308 B2 | 6/2004 | Mitros et al. | |
| 6,750,499 B2 | 6/2004 | Wu | |
| 6,762,092 B2 | 7/2004 | Yuan et al. | |
| 6,803,620 B2 | 10/2004 | Moriya et al. | |
| 6,816,414 B1 | 11/2004 | Prinz | |
| 6,818,508 B2 | 11/2004 | Shimizu et al. | |
| 6,818,512 B1 | 11/2004 | Hsieh | |
| 6,818,939 B1 | 11/2004 | Hadizad | |
| 6,853,587 B2 | 2/2005 | Forbes | |
| 6,861,315 B1 | 3/2005 | Chen et al. | |
| 6,864,540 B1 | 3/2005 | Divakaruni et al. | |
| 6,881,994 B2 | 4/2005 | Lee et al. | |
| 6,894,339 B2 | 5/2005 | Fan et al. | |
| 6,903,418 B2 | 6/2005 | Iwamoto et al. | |
| 6,916,715 B2 | 7/2005 | Hsiao et al. | |
| 6,936,887 B2 | 8/2005 | Harari et al. | |
| 6,952,034 B2 | 10/2005 | Hu et al. | |
| 6,958,513 B2 | 10/2005 | Wang et al. | |
| 6,991,984 B2 | 1/2006 | Ingersoll et al. | |
| 7,015,537 B2 | 3/2006 | Lee et al. | |
| 7,037,787 B2 | 5/2006 | Fan et al. | |
| 7,045,423 B2 | 5/2006 | Ichige et al. | |
| 7,078,286 B1 | 7/2006 | Mehta | |
| 7,098,502 B2 | 8/2006 | Mathew et al. | |
| 7,112,490 B1 | 9/2006 | Hong et al. | |
| 7,122,432 B2 | 10/2006 | Shimizu et al. | |
| 7,126,188 B2 | 10/2006 | Shone | |
| 7,192,830 B2 | 3/2007 | Goldbach et al. | |
| 7,199,419 B2 | 4/2007 | Haller | |
| 7,220,634 B2 | 5/2007 | Prall et al. | |
| 7,259,984 B2 | 8/2007 | Kan et al. | |
| 7,279,740 B2 | 10/2007 | Bhattacharyya et al. | |
| 7,371,642 B2 | 5/2008 | Forbes | |
| 2003/0062565 A1 | 4/2003 | Yamazaki et al. | |
| 2003/0068864 A1 | 4/2003 | Park et al. | |
| 2003/0071302 A1 | 4/2003 | Hirotomo et al. | |
| 2004/0121540 A1 | 6/2004 | Lin | |
| 2005/0146938 A1 | 7/2005 | Forbes | |
| 2005/0148173 A1 | 7/2005 | Shone | |
| 2005/0242391 A1 | 11/2005 | She et al. | |
| 2005/0259475 A1 | 11/2005 | Forbes | |
| 2005/0280089 A1 | 12/2005 | Forbes | |
| 2005/0280094 A1 | 12/2005 | Forbes | |
| 2005/0285177 A1* | 12/2005 | Shone | 257/315 |
| 2006/0011966 A1 | 1/2006 | Wang | |
| 2006/0046383 A1 | 3/2006 | Chen et al. | |
| 2006/0131640 A1 | 6/2006 | Yu et al. | |
| 2006/0152978 A1 | 7/2006 | Forbes | |
| 2006/0166443 A1 | 7/2006 | Forbes | |
| 2007/0019472 A1* | 1/2007 | Yater et al. | 365/185.18 |
| 2007/0238249 A1 | 10/2007 | Swift et al. | |

OTHER PUBLICATIONS

U.S. Appl. No. 10/961,295, filed Oct. 8, 2004.
U.S. Appl. No. 11/079,674, filed Mar. 14, 2005.
U.S. Appl. No. 11/188,582, filed Jul. 25, 2005.
U.S. Appl. No. 11/188,583, filed Jul. 25, 2005.
U.S. Appl. No. 11/188,584, filed Jul. 25, 2005.
U.S. Appl. No. 11/188,585, filed Jul. 25, 2005.
U.S. Appl. No. 11/188,588, filed Jul. 25, 2005.
U.S. Appl. No. 11/188,591, filed Jul. 25, 2005.
U.S. Appl. No. 11/188,603, filed Jul. 25, 2005.
U.S. Appl. No. 11/525,747, filed Sep. 22, 2006.
U.S. Appl. No. 11/188,615, filed Jul. 25, 2005.
U.S. Appl. No. 11/188,898, filed Jul. 25, 2005.
U.S. Appl. No. 11/188,909, filed Jul. 25, 2005.
U.S. Appl. No. 11/188,910, filed Jul. 25, 2005.
U.S. Appl. No. 11/188,935, filed Jul. 25, 2005.
U.S. Appl. No. 11/188,939, filed Jul. 25, 2005.
U.S. Appl. No. 11/188,953, filed Jul. 25, 2005.
U.S. Appl. No. 11/188,999, filed Jul. 25, 2005.
Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.
Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.
Hayashi, Y., et al. "Twin MONOS Cell with Dual Control Gates," 2000 Symposium on VLSI Technology Digest of Technical Papers, pp. 122-123, 2000.
Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.
Ma, Y. et al. "A Dual-Bit Split-Gate EEPROM (DSG) Cell in Contactless Array for Single-Vcc High Density Flash Memories," IEDM p. 57-60, 1994.
Osabe, T. et al. "Charge-Injection Length in Silicon Nanocrystal Memory Cells," 2004 Symposium on VLSI Technology Digest of Technical Papers p. 242-243, 2004.
Actions on the Merits by U.S.P.T.O, as of Mar. 20, 2008, 12 pgs.
Yang, Edward S., "8.3 Channel Conductance", Fundamentals of Semiconductor Devices, McGraw-Hill Book Company, p. 205, 1978.
Actions on the Merits by U.S.P.T.O, as of Jul. 24, 2009, 14 pgs.
U.S. Appl. No. 11/188,935 Advisory Action mailed Apr. 17, 2009, 4 pages.
U.S. Appl. No. 11/393,287 Notice of Allowance mailed May 29, 2009, 6 pages.
U.S. Appl. No. 11/188,615 Notice of Abandonment mailed Apr. 24, 2008, 2 pages.
U.S. Appl. No. 11/188,935 Notice of Allowance mailed Jul. 9, 2009, 8 pages.
U.S. Appl. No. 11/626,762 Notice of Allowance mailed Apr. 17, 2009, 9 pages.
U.S. Appl. No. 11/188,999 Notice of Allowance mailed May 4, 2009, 20 pages.
U.S. Appl. No. 11/188,591 Notice of Allowance mailed Jul. 24, 2009, 4 pages.
Actions on the Merits by U.S.P.T.O, as of Jul. 25, 2008, 13 pgs.

U.S. Appl. No. 11/834,391, filed Aug. 6, 2007.
Actions on the Merits by U.S.P.T.O, as of Aug. 8, 2007, 9 pgs.
Actions on the Merits by U.S.P.T. O, as of Oct. 24, 2008, 14 pgs.
Actions on the Merits by U.S.P.T.O, as of Nov. 8, 2007, 10 pgs.

U.S. Appl. No. 11/626,762, filed Jan. 25, 2007.
U.S. Appl. No. 11/626,768, filed Jan. 25, 2007.

* cited by examiner

FIG. 28

| | SG1 2101 | CG1 2181 | SG2 2102 | SG3 2103 | CG2 2182 | SG4 2104 | SG5 2105 | CG3 2183 | SG6 2106 | SG7 2107 | CG4 2184 | SG8 2108 | BL1 2161 | BL2 2162 | BL3 2163 | BL4 2164 |
|---|---|---|---|---|---|---|---|---|---|---|---|---|---|---|---|---|
| PGM 21111 | 3 | 8 | 3 | 0 | 0 | 0 | 0 | 0 | 0 | 0 | 0 | 0 | 5 | 0 | FLOAT | FLOAT |
| READ 21111 | 3 | 3 | 5 | 0 | 0 | 0 | 0 | 0 | 0 | 0 | 0 | 0 | 1 | 0 | FLOAT | FLOAT |
| PGM 21112 | 3 | 8 | 3 | 0 | 0 | 0 | 0 | 0 | 0 | 0 | 0 | 0 | 0 | 5 | FLOAT | FLOAT |
| READ 21112 | 5 | 3 | 3 | 0 | 0 | 0 | 0 | 0 | 0 | 0 | 0 | 0 | 0 | 1 | FLOAT | FLOAT |
| PGM 21121 | 0 | 0 | 0 | 3 | 8 | 3 | 0 | 0 | 0 | 0 | 0 | 0 | 5 | 0 | FLOAT | FLOAT |
| READ 21121 | 0 | 0 | 0 | 3 | 3 | 5 | 0 | 0 | 0 | 0 | 0 | 0 | 1 | 0 | FLOAT | FLOAT |
| PGM 21122 | 0 | 0 | 0 | 3 | 8 | 3 | 0 | 0 | 0 | 0 | 0 | 0 | 0 | 5 | FLOAT | FLOAT |
| READ 21122 | 0 | 0 | 0 | 5 | 3 | 3 | 0 | 0 | 0 | 0 | 0 | 0 | 0 | 1 | FLOAT | FLOAT |
| PGM 21131 | 0 | 0 | 0 | 0 | 0 | 0 | 3 | 8 | 3 | 0 | 0 | 0 | 5 | 0 | FLOAT | FLOAT |
| READ 21131 | 0 | 0 | 0 | 0 | 0 | 0 | 3 | 3 | 5 | 0 | 0 | 0 | 1 | 0 | FLOAT | FLOAT |
| PGM 21132 | 0 | 0 | 0 | 0 | 0 | 0 | 3 | 8 | 3 | 0 | 0 | 0 | 0 | 5 | FLOAT | FLOAT |
| READ 21132 | 0 | 0 | 0 | 0 | 0 | 0 | 5 | 3 | 3 | 0 | 0 | 0 | 0 | 1 | FLOAT | FLOAT |
| PGM 21141 | 0 | 0 | 0 | 0 | 0 | 0 | 0 | 0 | 0 | 3 | 8 | 3 | 5 | 0 | FLOAT | FLOAT |
| READ 21141 | 0 | 0 | 0 | 0 | 0 | 0 | 0 | 0 | 0 | 3 | 3 | 5 | 1 | 0 | FLOAT | FLOAT |
| PGM 21142 | 0 | 0 | 0 | 0 | 0 | 0 | 0 | 0 | 0 | 3 | 8 | 3 | 0 | 5 | FLOAT | FLOAT |
| READ 21142 | 0 | 0 | 0 | 0 | 0 | 0 | 0 | 0 | 0 | 5 | 3 | 3 | 0 | 1 | FLOAT | FLOAT |
| PGM 21211 | 3 | 8 | 3 | 0 | 0 | 0 | 0 | 0 | 0 | 0 | 0 | 0 | FLOAT | FLOAT | 5 | 0 |
| READ 21211 | 3 | 3 | 5 | 0 | 0 | 0 | 0 | 0 | 0 | 0 | 0 | 0 | FLOAT | FLOAT | 1 | 0 |
| PGM 21212 | 3 | 8 | 3 | 0 | 0 | 0 | 0 | 0 | 0 | 0 | 0 | 0 | FLOAT | FLOAT | 0 | 5 |
| READ 21212 | 5 | 3 | 3 | 0 | 0 | 0 | 0 | 0 | 0 | 0 | 0 | 0 | FLOAT | FLOAT | 0 | 1 |
| PGM 21221 | 0 | 0 | 0 | 3 | 8 | 3 | 0 | 0 | 0 | 0 | 0 | 0 | FLOAT | FLOAT | 5 | 0 |
| READ 21221 | 0 | 0 | 0 | 3 | 3 | 5 | 0 | 0 | 0 | 0 | 0 | 0 | FLOAT | FLOAT | 1 | 0 |
| PGM 21222 | 0 | 0 | 0 | 3 | 8 | 3 | 0 | 0 | 0 | 0 | 0 | 0 | FLOAT | FLOAT | 0 | 5 |
| READ 21222 | 0 | 0 | 0 | 5 | 3 | 3 | 0 | 0 | 0 | 0 | 0 | 0 | FLOAT | FLOAT | 0 | 1 |
| PGM 21231 | 0 | 0 | 0 | 0 | 0 | 0 | 3 | 8 | 3 | 0 | 0 | 0 | FLOAT | FLOAT | 5 | 0 |
| READ 21231 | 0 | 0 | 0 | 0 | 0 | 0 | 3 | 3 | 5 | 0 | 0 | 0 | FLOAT | FLOAT | 1 | 0 |
| PGM 21232 | 0 | 0 | 0 | 0 | 0 | 0 | 3 | 8 | 3 | 0 | 0 | 0 | FLOAT | FLOAT | 0 | 5 |
| READ 21232 | 0 | 0 | 0 | 0 | 0 | 0 | 5 | 3 | 3 | 0 | 0 | 0 | FLOAT | FLOAT | 0 | 1 |
| PGM 21241 | 0 | 0 | 0 | 0 | 0 | 0 | 0 | 0 | 0 | 3 | 8 | 3 | FLOAT | FLOAT | 5 | 0 |
| READ 21241 | 0 | 0 | 0 | 0 | 0 | 0 | 0 | 0 | 0 | 3 | 3 | 5 | FLOAT | FLOAT | 1 | 0 |
| PGM 21242 | 0 | 0 | 0 | 0 | 0 | 0 | 0 | 0 | 0 | 3 | 8 | 3 | FLOAT | FLOAT | 0 | 5 |
| READ 21242 | 0 | 0 | 0 | 0 | 0 | 0 | 0 | 0 | 0 | 5 | 3 | 3 | FLOAT | FLOAT | 0 | 1 |

FIG. 31

| | GL1 2441 | SG1 2401 | GL2 2442 | GL3 2443 | SG2 2402 | GL4 2444 | GL5 2445 | SG3 2403 | GL6 2446 | GL7 2447 | SG4 2404 | GL8 2448 | BL1 2461 | BL2 2462 | BL3 2463 | BL4 2464 |
|---|---|---|---|---|---|---|---|---|---|---|---|---|---|---|---|---|
| PGM 24111 | 8 | 6 | 6 | 0 | 0 | 0 | 0 | 0 | 0 | 0 | 0 | 0 | 5 | 0 | FLOAT | FLOAT |
| READ 24111 | 3 | 5 | 6 | 0 | 0 | 0 | 0 | 0 | 0 | 0 | 0 | 0 | 1 | 0 | FLOAT | FLOAT |
| PGM 24112 | 8 | 3 | 6 | 0 | 0 | 0 | 0 | 0 | 0 | 0 | 0 | 0 | 5 | 0 | FLOAT | FLOAT |
| READ 24112 | 3 | 3 | 6 | 0 | 0 | 0 | 0 | 0 | 0 | 0 | 0 | 0 | 2 | 1 | FLOAT | FLOAT |
| PGM 24113 | 6 | 3 | 8 | 0 | 0 | 0 | 0 | 0 | 0 | 0 | 0 | 0 | 0 | 5 | FLOAT | FLOAT |
| READ 24113 | 6 | 3 | 3 | 0 | 0 | 0 | 0 | 0 | 0 | 0 | 0 | 0 | 1 | 2 | FLOAT | FLOAT |
| PGM 24114 | 6 | 6 | 6 | 8 | 0 | 0 | 0 | 0 | 0 | 0 | 0 | 0 | 0 | 5 | FLOAT | FLOAT |
| READ 24114 | 6 | 5 | 3 | 3 | 0 | 0 | 0 | 0 | 0 | 0 | 0 | 0 | 0 | 1 | FLOAT | FLOAT |
| PGM 24121 | 0 | 0 | 0 | 8 | 6 | 6 | 0 | 0 | 0 | 0 | 0 | 0 | 5 | 0 | FLOAT | FLOAT |
| READ 24121 | 0 | 0 | 0 | 3 | 5 | 6 | 0 | 0 | 0 | 0 | 0 | 0 | 1 | 0 | FLOAT | FLOAT |
| PGM 24122 | 0 | 0 | 0 | 8 | 3 | 6 | 0 | 0 | 0 | 0 | 0 | 0 | 5 | 0 | FLOAT | FLOAT |
| READ 24122 | 0 | 0 | 0 | 3 | 3 | 6 | 0 | 0 | 0 | 0 | 0 | 0 | 2 | 1 | FLOAT | FLOAT |
| PGM 24123 | 0 | 0 | 0 | 6 | 3 | 8 | 0 | 0 | 0 | 0 | 0 | 0 | 0 | 5 | FLOAT | FLOAT |
| READ 24123 | 0 | 0 | 0 | 6 | 3 | 3 | 0 | 0 | 0 | 0 | 0 | 0 | 1 | 2 | FLOAT | FLOAT |
| PGM 24124 | 0 | 0 | 0 | 6 | 6 | 6 | 8 | 0 | 0 | 0 | 0 | 0 | 0 | 5 | FLOAT | FLOAT |
| READ 24124 | 0 | 0 | 0 | 6 | 5 | 3 | 3 | 0 | 0 | 0 | 0 | 0 | 0 | 1 | FLOAT | FLOAT |
| PGM 24131 | 0 | 0 | 0 | 0 | 0 | 0 | 8 | 6 | 6 | 0 | 0 | 0 | 5 | 0 | FLOAT | FLOAT |
| READ 24131 | 0 | 0 | 0 | 0 | 0 | 0 | 3 | 5 | 6 | 0 | 0 | 0 | 1 | 0 | FLOAT | FLOAT |
| PGM 24132 | 0 | 0 | 0 | 0 | 0 | 0 | 8 | 3 | 6 | 0 | 0 | 0 | 5 | 0 | FLOAT | FLOAT |
| READ 24132 | 0 | 0 | 0 | 0 | 0 | 0 | 3 | 3 | 6 | 0 | 0 | 0 | 2 | 1 | FLOAT | FLOAT |
| PGM 24133 | 0 | 0 | 0 | 0 | 0 | 0 | 6 | 3 | 8 | 0 | 0 | 0 | 0 | 5 | FLOAT | FLOAT |
| READ 24133 | 0 | 0 | 0 | 0 | 0 | 0 | 6 | 3 | 3 | 0 | 0 | 0 | 1 | 2 | FLOAT | FLOAT |
| PGM 24134 | 0 | 0 | 0 | 0 | 0 | 0 | 6 | 6 | 6 | 8 | 0 | 0 | 0 | 5 | FLOAT | FLOAT |
| READ 24134 | 0 | 0 | 0 | 0 | 0 | 0 | 6 | 5 | 3 | 3 | 0 | 0 | 0 | 1 | FLOAT | FLOAT |
| PGM 24141 | 0 | 0 | 0 | 0 | 0 | 0 | 0 | 0 | 0 | 8 | 6 | 6 | 5 | 0 | FLOAT | FLOAT |
| READ 24141 | 0 | 0 | 0 | 0 | 0 | 0 | 0 | 0 | 0 | 3 | 5 | 6 | 1 | 0 | FLOAT | FLOAT |
| PGM 24142 | 0 | 0 | 0 | 0 | 0 | 0 | 0 | 0 | 0 | 8 | 3 | 6 | 5 | 0 | FLOAT | FLOAT |
| READ 24142 | 0 | 0 | 0 | 0 | 0 | 0 | 0 | 0 | 0 | 3 | 3 | 6 | 2 | 1 | FLOAT | FLOAT |
| PGM 24143 | 0 | 0 | 0 | 0 | 0 | 0 | 0 | 0 | 0 | 6 | 3 | 8 | 0 | 5 | FLOAT | FLOAT |
| READ 24143 | 0 | 0 | 0 | 0 | 0 | 0 | 0 | 0 | 0 | 6 | 3 | 3 | 1 | 2 | FLOAT | FLOAT |
| PGM 24144 | 0 | 0 | 0 | 0 | 0 | 0 | 0 | 0 | 0 | 6 | 6 | 8 | 0 | 5 | FLOAT | FLOAT |
| READ 24144 | 0 | 0 | 0 | 0 | 0 | 0 | 0 | 0 | 0 | 6 | 5 | 3 | 0 | 1 | FLOAT | FLOAT |

FIG. 32

| | GL1 2441 | SG1 2401 | GL2 2442 | GL3 2443 | SG2 2402 | GL4 2444 | GL5 2445 | SG3 2403 | GL6 2446 | GL7 2447 | SG4 2404 | GL8 2448 | BL1 2461 | BL2 2462 | BL3 2463 | BL4 2464 |
|---|---|---|---|---|---|---|---|---|---|---|---|---|---|---|---|---|
| PGM 24211 | 8 | 6 | 6 | 0 | 0 | 0 | 0 | 0 | 0 | 0 | 0 | 0 | FLOAT | FLOAT | 5 | 0 |
| READ 24211 | 3 | 5 | 6 | 0 | 0 | 0 | 0 | 0 | 0 | 0 | 0 | 0 | FLOAT | FLOAT | 1 | 0 |
| PGM 24212 | 8 | 3 | 6 | 0 | 0 | 0 | 0 | 0 | 0 | 0 | 0 | 0 | FLOAT | FLOAT | 5 | 0 |
| READ 24212 | 3 | 3 | 6 | 0 | 0 | 0 | 0 | 0 | 0 | 0 | 0 | 0 | FLOAT | FLOAT | 2 | 1 |
| PGM 24213 | 6 | 3 | 8 | 0 | 0 | 0 | 0 | 0 | 0 | 0 | 0 | 0 | FLOAT | FLOAT | 0 | 5 |
| READ 24213 | 6 | 3 | 3 | 0 | 0 | 0 | 0 | 0 | 0 | 0 | 0 | 0 | FLOAT | FLOAT | 1 | 2 |
| PGM 24214 | 6 | 6 | 8 | 0 | 0 | 0 | 0 | 0 | 0 | 0 | 0 | 0 | FLOAT | FLOAT | 0 | 5 |
| READ 24214 | 6 | 5 | 3 | 0 | 0 | 0 | 0 | 0 | 0 | 0 | 0 | 0 | FLOAT | FLOAT | 5 | 1 |
| PGM 24221 | 0 | 0 | 0 | 8 | 6 | 6 | 0 | 0 | 0 | 0 | 0 | 0 | FLOAT | FLOAT | 1 | 0 |
| READ 24221 | 0 | 0 | 0 | 3 | 5 | 6 | 0 | 0 | 0 | 0 | 0 | 0 | FLOAT | FLOAT | 0 | 0 |
| PGM 24222 | 0 | 0 | 0 | 8 | 3 | 6 | 0 | 0 | 0 | 0 | 0 | 0 | FLOAT | FLOAT | 0 | 1 |
| READ 24222 | 0 | 0 | 0 | 3 | 3 | 6 | 0 | 0 | 0 | 0 | 0 | 0 | FLOAT | FLOAT | 5 | 5 |
| PGM 24223 | 0 | 0 | 0 | 6 | 3 | 8 | 0 | 0 | 0 | 0 | 0 | 0 | FLOAT | FLOAT | 1 | 2 |
| READ 24223 | 0 | 0 | 0 | 6 | 3 | 3 | 0 | 0 | 0 | 0 | 0 | 0 | FLOAT | FLOAT | 0 | 5 |
| PGM 24224 | 0 | 0 | 0 | 6 | 6 | 8 | 0 | 0 | 0 | 0 | 0 | 0 | FLOAT | FLOAT | 0 | 1 |
| READ 24224 | 0 | 0 | 0 | 6 | 5 | 3 | 0 | 0 | 0 | 0 | 0 | 0 | FLOAT | FLOAT | 5 | 0 |
| PGM 24231 | 0 | 0 | 0 | 0 | 0 | 0 | 8 | 6 | 6 | 0 | 0 | 0 | FLOAT | FLOAT | 0 | 0 |
| READ 24231 | 0 | 0 | 0 | 0 | 0 | 0 | 3 | 5 | 6 | 0 | 0 | 0 | FLOAT | FLOAT | 1 | 1 |
| PGM 24232 | 0 | 0 | 0 | 0 | 0 | 0 | 8 | 3 | 6 | 0 | 0 | 0 | FLOAT | FLOAT | 5 | 5 |
| READ 24232 | 0 | 0 | 0 | 0 | 0 | 0 | 3 | 3 | 6 | 0 | 0 | 0 | FLOAT | FLOAT | 2 | 2 |
| PGM 24233 | 0 | 0 | 0 | 0 | 0 | 0 | 6 | 3 | 8 | 0 | 0 | 0 | FLOAT | FLOAT | 0 | 0 |
| READ 24233 | 0 | 0 | 0 | 0 | 0 | 0 | 6 | 3 | 3 | 0 | 0 | 0 | FLOAT | FLOAT | 1 | 1 |
| PGM 24234 | 0 | 0 | 0 | 0 | 0 | 0 | 6 | 6 | 8 | 0 | 0 | 0 | FLOAT | FLOAT | 0 | 0 |
| READ 24234 | 0 | 0 | 0 | 0 | 0 | 0 | 6 | 5 | 3 | 0 | 0 | 0 | FLOAT | FLOAT | 5 | 5 |
| PGM 24241 | 0 | 0 | 0 | 0 | 0 | 0 | 0 | 0 | 0 | 8 | 6 | 6 | FLOAT | FLOAT | 1 | 1 |
| READ 24241 | 0 | 0 | 0 | 0 | 0 | 0 | 0 | 0 | 0 | 3 | 5 | 6 | FLOAT | FLOAT | 0 | 0 |
| PGM 24242 | 0 | 0 | 0 | 0 | 0 | 0 | 0 | 0 | 0 | 8 | 3 | 6 | FLOAT | FLOAT | 5 | 5 |
| READ 24242 | 0 | 0 | 0 | 0 | 0 | 0 | 0 | 0 | 0 | 3 | 3 | 6 | FLOAT | FLOAT | 1 | 2 |
| PGM 24243 | 0 | 0 | 0 | 0 | 0 | 0 | 0 | 0 | 0 | 6 | 3 | 8 | FLOAT | FLOAT | 0 | 5 |
| READ 24243 | 0 | 0 | 0 | 0 | 0 | 0 | 0 | 0 | 0 | 6 | 3 | 3 | FLOAT | FLOAT | 1 | 2 |
| PGM 24244 | 0 | 0 | 0 | 0 | 0 | 0 | 0 | 0 | 0 | 6 | 6 | 8 | FLOAT | FLOAT | 0 | 5 |
| READ 24244 | 0 | 0 | 0 | 0 | 0 | 0 | 0 | 0 | 0 | 6 | 5 | 3 | FLOAT | FLOAT | 0 | 1 |

ELECTRONIC DEVICE INCLUDING TRENCHES AND DISCONTINUOUS STORAGE ELEMENTS

CROSS-REFERENCE TO RELATED APPLICATIONS

This application is related to U.S. patent application Ser. No. 11/262,762 entitled "Electronic Device Including Fins and Discontinuous Storage Elements and Processes of Forming and Using the Same" by Hong et al. filed on Jan. 24, 2007, now U.S. Pat. No. 7,572,699, and U.S. patent application Ser. No. 11/262,768 entitled "Electronic Device Including Trenches and Discontinuous Storage Elements and Processes of Forming and Using the Same" by Li et al. filed on Jan. 24, 2007, both of which are assigned to the current assignee hereof.

BACKGROUND

1. Field of the Disclosure

The present invention relates to electronic devices and processes, and more particularly, to electronic devices including trenches and discontinuous storage elements and processes of forming and using the electronic devices.

2. Description of the Related Art

Floating gate nonvolatile memories ("FG NVM") are conventional and are commonly used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating gate or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 26 through 32 include circuit schematic diagrams, cross-sectional views of exemplary physical embodiments of the circuit schematic diagrams, and operating voltage tables for memory cell along a row within an NVM array.

Figure 1:
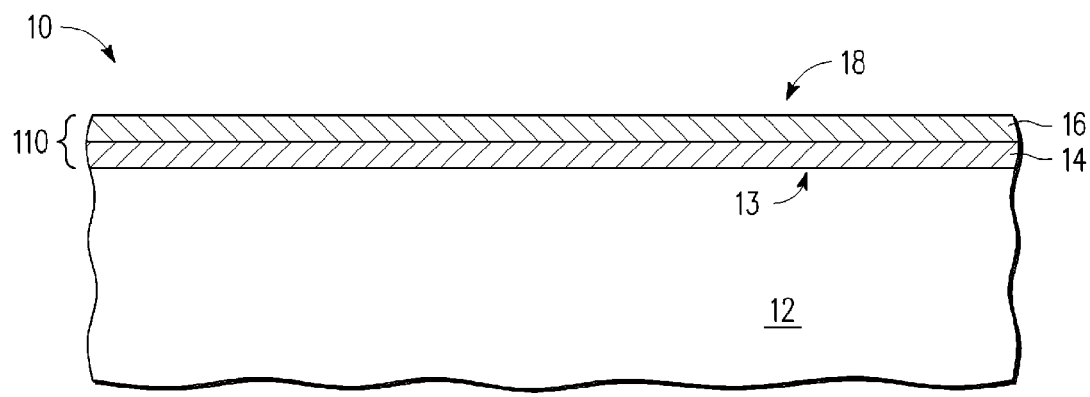
FIG. 1 includes an illustration of a cross-sectional view of a portion of a workpiece after forming a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a substrate including a trench having a bottom and a first wall. The electronic device can also include a first gate electrode within the trench and adjacent to the first wall and overlying the bottom of the trench, a second gate electrode overlying the substrate outside of the trench, and a third gate electrode within the trench and adjacent to the first gate electrode and overlying the bottom of the trench. The electronic device can also include discontinuous storage elements including a first set of discontinuous storage elements, wherein the first set of the discontinuous storage elements lies adjacent to the first wall of the trench. Processes of forming and using the electronic device are also described.

The processes and structures described allow memory cells or portions thereof to be formed with gate electrodes and doped regions adjacent to the gate electrodes that have dimensions smaller than the resolution limits of lithographic processes. Also, a set of gate electrodes is formed within and outside of each trench. The embodiments can also be used to form three-transistor memory cells, which can allow for lower leakage current when the transistor is not being used (e.g., other memory cells being programmed or read, or the NVM array 18 is idling). Other embodiments described herein allow for an electronic device having a contactless array.

Before addressing details of embodiments described below, some terms are defined or clarified. The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "oriented" is intended to mean a principal direction in which a feature extends (e.g., from a top view, the longer of two dimensions of the feature, such as the length). As between different features at the same elevation or at different elevations, the features may be oriented substantially parallel, substantially perpendicular, or another angular relationship with respect to each other.

The term "stack" is intended to mean a plurality of layers or a plurality of at least one layer and at least one structure (e.g., nanocrystals), wherein the plurality of layers or plurality of layer(s) and structure(s) provides an electronic function. For example, a nonvolatile memory stack can include layers used to form at least part of a nonvolatile memory cell. A stack may be part of a larger stack. For example, a nonvolatile memory stack can include a charge storage stack that is used to store charge within a nonvolatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. To the extent not described herein, many details regarding specific materials, processing acts, and circuits are conventional and may be found in textbooks and other sources within the semiconductor and microelectronic arts.

FIG. 1 includes a cross-sectional view of a portion of an electronic device 10, such as an integrated circuit. The integrated circuit can be a standalone memory, a microcontroller, or other integrated circuit that includes a memory. In one embodiment, the electronic device 10 can include a nonvolatile memory ("NVM") array 18, a portion of which is illustrated in FIG. 1. A substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of the substrate 12 in peripheral areas outside of the NVM array 18. The upper most surface of substrate 12 is a primary surface 13. Optionally, the doping concentration of the substrate 12 along the primary surface 13 within the NVM array 18 can be increased using a conventional or proprietary doping operation to potentially reduce leakage current between subsequently-formed gate electrodes that may overlie portions of the primary surface 13. A protective layer 110 can be formed over the primary surface 13 of the substrate 12. The protective layer 110 can include a pad layer 14 and an oxidation-resistant layer 16 over the pad layer 14. The protective layer 110 could have more or fewer layers than are illustrated. The protective layer 110 can remain over the peripheral areas until fabrication of the NVM array 18 is substantially completed. In one embodiment, the pad layer 14 includes oxide, and the oxidation-resistant layer 16 includes nitride.

Figure 2:
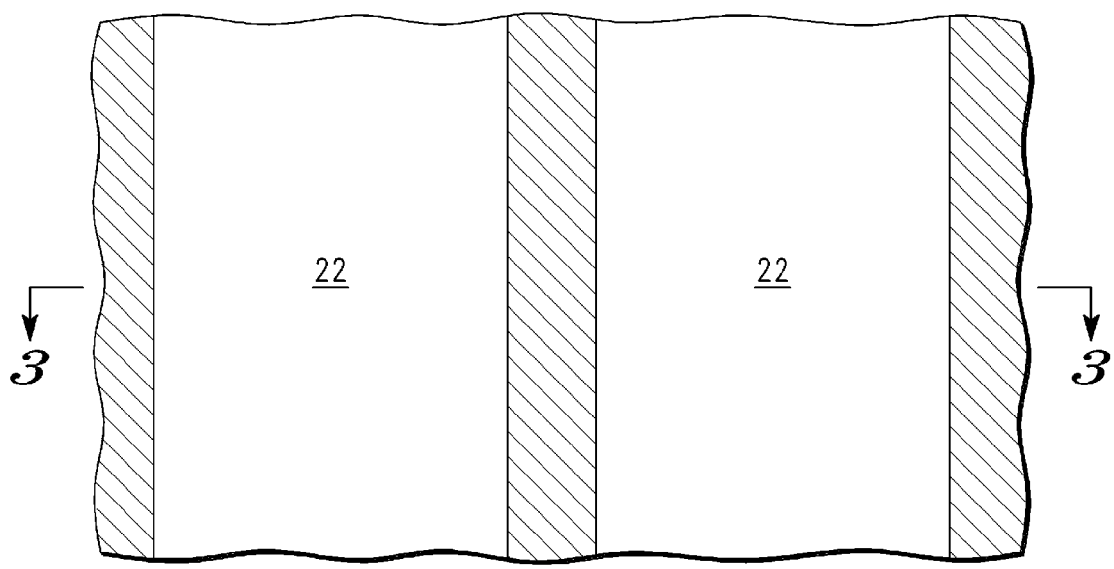
FIGS. 2 and 3 include illustrations of a top view and a cross-sectional view, respectively, of the workpiece of FIG. 1 after forming trenches.
Figure 3:
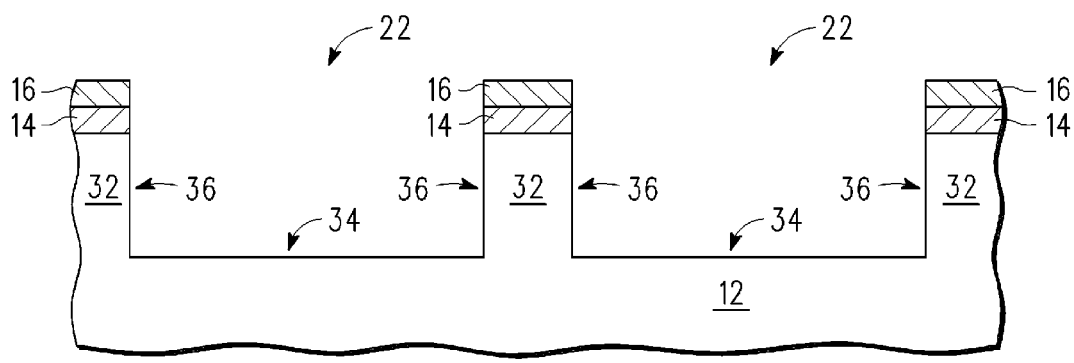

FIGS. 2 and 3 include illustrations of a top view and a cross-sectional view, respectively, of the memory array after etching trenches 22 to define mesas 32. A patterned resist layer (not illustrated), which includes openings at locations within the NVM array 18 where trenches are to be formed, is formed over the substrate 12 by a conventional or proprietary technique. Exposed portions of the protective layer 110 can then be removed by a conventional or proprietary technique to expose the primary surface 13. In one embodiment, the trenches 22 are formed prior to removal of the patterned resist layer. The patterned resist layer can then be removed, and the trenches 22 can then be formed by a conventional or proprietary technique. The trenches 22 extend from primary surface 13 and include bottoms 34 and walls 36. Referring to FIG. 2, the trenches 22 are oriented substantially parallel to one another. In one embodiment, the depths of trenches 22 are in a range of approximately 50 to approximately 500 nm. In one particular embodiment, the trenches 22 are formed using a timed anisotropic etch to produce the walls 36 that are substantially vertical. In one embodiment, the trenches 22 have substantially uniform depths. The trenches 22 are spaced apart from one another by the mesas 32, which include remaining portions of the substrate 12 between the trenches 22. After reading this specification, skilled artisans will appreciate that the trenches 22 can be shallower or deeper in other embodiments. Remaining portions of the protective layer 110 can be removed using a conventional or proprietary technique.

Figure 4:
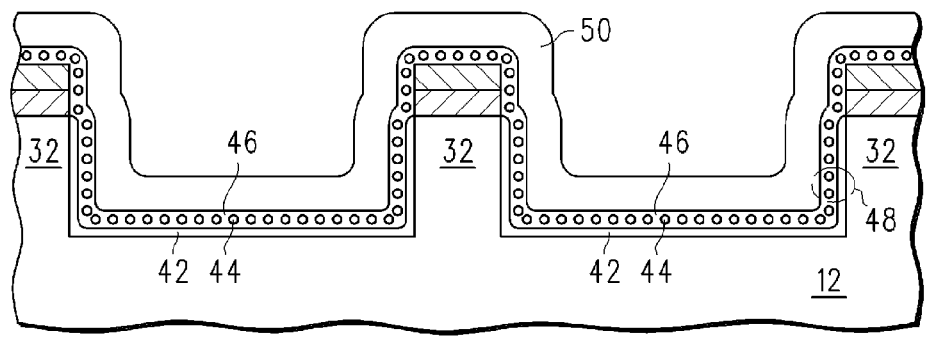
FIG. 4 includes an illustration of a cross-sectional view of a workpiece of FIGS. 2 and 3 after forming a charge storage stack including discontinuous storage elements and a layer of a gate electrode material.

A charge storage stack 48, including a dielectric layer 42, discontinuous storage elements 44, and another dielectric layer 46, can then be formed, as illustrated in FIG. 4. The dielectric layer 42 may be thermally grown using an oxidizing or nitridizing ambient, or deposited using a conventional or proprietary chemical vapor deposition technique, physical vapor deposition technique, atomic layer deposition technique, or a combination thereof. The dielectric layer 42 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The dielectric layer 42 has a thickness in a range of approximately 1 to approximately 10 nm. The thickness and material selection of the dielectric layer 42 will substantially determine its electrical properties. In one embodiment the thickness and material are chosen such that the dielectric layer 42 has a silicon dioxide equivalent thickness of less than 10 nm.

The discontinuous storage elements 44 are then formed over NVM array 18. In one embodiment, discontinuous storage elements 44 overlie the mesas 32 (including the primary surface 13 of the substrate 12) and lie within trenches 22. The individual discontinuous storage elements 44 are substantially physically separated from each other. The discontinuous storage elements 44 can include a material capable of storing a charge, such as silicon, a nitride, a metal-containing material, another suitable material capable of storing charge, or any combination thereof. For example, the discontinuous storage elements 44 can include silicon nanocrystals or metal nanoclusters. In one particular embodiment, a substantially continuous layer of amorphous silicon can be formed over exposed surfaces of the substrate 12. The substantially continuous layer can be exposed to heat or other processing conditions that can cause the layer to "ball up" or otherwise form silicon nanocrystals. The discontinuous storage elements 44 may be undoped, doped during deposition, or doped after deposition. In one embodiment, the discontinuous storage elements 44 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of the discontinuous storage elements 44 is no greater than approximately 10 nm in any dimension. In another embodiment, the discontinuous storage elements 44 can be larger, however, the discontinuous storage elements 44 are not formed so large as to form a continuous structure (i.e., all of the discontinuous storage elements 44 are not fused together).

The dielectric layer 46 is then formed over the discontinuous storage elements 44. The dielectric layer 46 can include one or more dielectric films, any of which may be thermally grown or deposited. The dielectric layer 46 can include any one or more materials or be formed using any of the embodiments as described with respect to the dielectric 42 layer. The dielectric layer 46 can have the same or different composition compared to the dielectric 42 layer and may be formed using the same or different formation technique compared to the dielectric layer 42.

A gate electrode material 50 is then formed overlying the workpiece and only partly fills remaining portions of the trenches 22, as illustrated in FIG. 4. The gate electrode material 50 can include a semiconductor-containing film, a metal-containing film, or any combination thereof. In one embodiment, the gate electrode material 50 includes polysilicon or amorphous silicon. In another embodiment, the gate electrode material 50 may include one or more other materials. In a particular embodiment, the thickness of gate electrode material 50 is not greater than approximately 200 nm, and in another particular embodiment is no greater than 90 nm. In yet another embodiment, the thickness of gate electrode material 50 is at least approximately 20 nm, and in another particular embodiment is at least 50 nm. In a finished device, the gate electrode material 50 can have a dopant concentration of at least 1E19 atoms/cm$^3$ when gate electrode material 50 includes polysilicon or amorphous silicon.

The gate electrode material 50 can be deposited by chemical vapor deposition, physical vapor deposition, or a combination thereof. In an embodiment, the gate electrode material 50 can be deposited substantially conformally. In another embodiment, the gate electrode material 50 may not be completely conformal; however, a significant portion of the gate electrode material 50 still forms along the charge storage stack 48 near the walls 36 of the trenches 22. In one particular embodiment, the gate electrode material 50 is doped when deposited, and in another particular embodiment, is doped after it is deposited.

Figure 5:
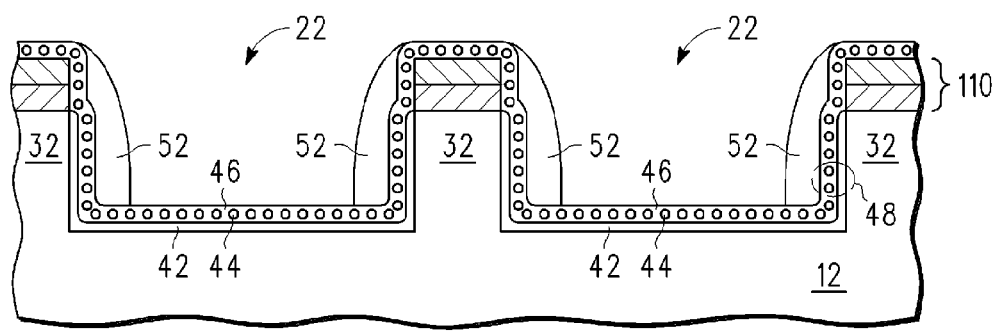
FIG. 5 includes an illustration of a cross-sectional view of a workpiece of FIG. 4 after forming gate electrodes.

FIG. 5 includes an illustration of a cross-sectional view after the gate electrode material 50 has been etched to form gate electrodes 52. In one embodiment, an anisotropic etch is performed to remove portions of gate electrode material 50 overlying the mesas 32 and portions of the bottoms of the trenches 22. In one embodiment, the gate electrodes 52 are in the form of sidewall spacers and have an arc-shaped outer surface, although other shapes can be used in other embodiments. In one embodiment, the bases of the gate electrodes 52 have widths that are approximately the same as the thickness of the gate electrode material as deposited. In another embodiment, the bases have widths that are at least half of the thickness of the gate electrode material as deposited. In a particular embodiment, each of the bases of the gate electrodes 52 are in a range of approximately 50 to approximately 90 nm wide. The etching chemistry and other etching parameters can use conventional or proprietary etching chemistries and etching parameters used for etching gate electrode materials. Although not illustrated, a mask and etch process sequence can be used to separate the gate electrodes 52 at the ends of the trenches 22, so that the gate electrodes 52 lying adjacent to opposite sides of the trenches 22 are not electrically shorted to each other. Portions of the charge storage stack 48 overlying the mesas 32 and lying between the gate electrodes 52 within the trenches 22 become exposed.

Figure 6:
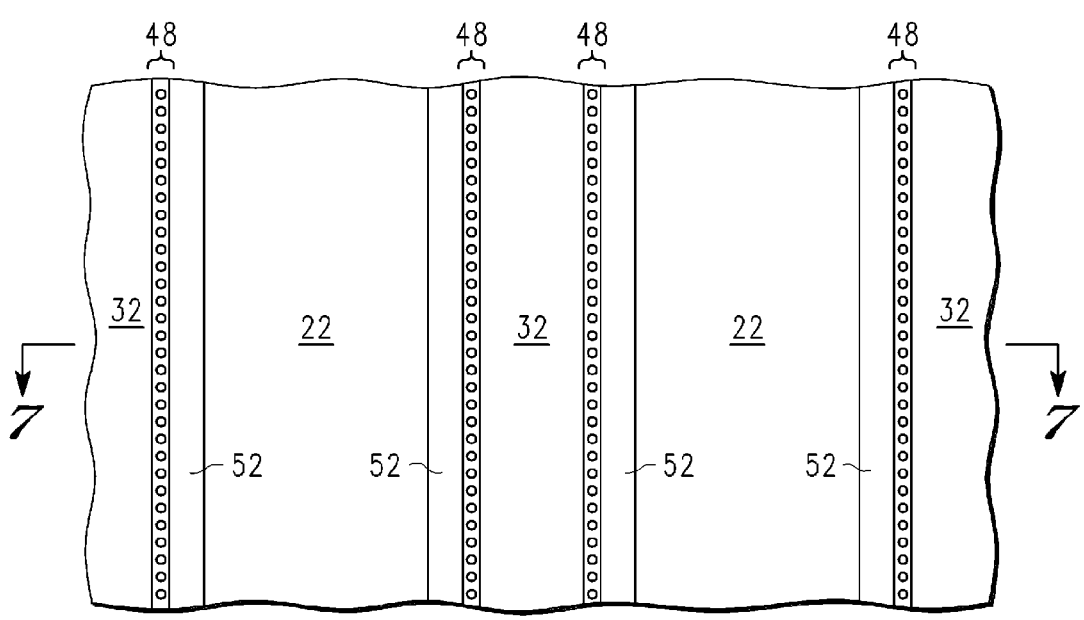
FIGS. 6 and 7 include illustrations of a top view and a cross-sectional view, respectively, of the workpiece of FIG. 5 after removing portions of the charge storage stack and forming insulating layers on exposed surfaces of the substrate and gate electrodes.
Figure 7:
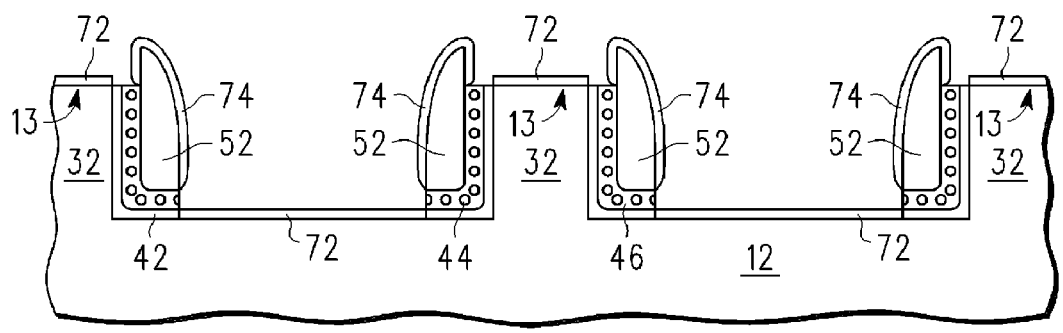

FIGS. 6 and 7 include illustrations of a top view and a cross-sectional view, respectively, after removing portions of the discontinuous storage elements 44 that are not protected by the gate electrodes 52 and remaining portions of the protective layer 110. In FIG. 6 and other top views, some dielectric or insulating layers are not illustrated to simplify understanding of positional relationships between features within NVM array 18. The portions of the discontinuous storage elements 44 can be removed by removing substantially all of the exposed portions of the charge storage stack 48, removing part of the of the exposed portions of the charge storage stack 48, thermally consuming (e.g., oxidizing or nitriding) the portions of the discontinuous storage elements 44, or any combination thereof. As illustrated in the embodiment of FIG. 6, the trenches 22, the mesas 32, and the gate electrodes 52 are oriented substantially parallel to one another.

In one embodiment, substantially all of the exposed portions of the charge storage stack 48 are removed. In this embodiment, the dielectric layer 46 and the dielectric layer 42 can be etched. In a particular embodiment, the dielectric layer 42 can be removed by a wet etch that undercuts discontinuous storage elements 44, allowing them to be rinsed away. In another embodiment, exposed portions of dielectric layer 46 are removed, exposing discontinuous storage elements 44, which can then undergo additional processing to convert them from an electrically conducting material to an electrically insulating material. In one particular embodiment, discontinuous storage elements 44 are silicon nanocrystals that are oxidized to form silicon dioxide. In still another embodiment, the discontinuous storage elements 44 are etched, and the dielectric layer 42 remains. After reading this specification, skilled artisans will appreciate that other processes can be used to selectively remove the discontinuous storage elements 44 that are not protected by the gate electrodes 52.

Remaining portions of the protective layer 110 over the mesas (FIG. 5) are then removed as illustrated in FIGS. 6 and 7. If any discontinuous storage elements 44 still remain over the protective layer, the such discontinuous storage elements 44 can be removed when the underlying protective layer 110 is removed. A conventional or proprietary technique can be used to remove the oxidation-resistant layer 16 and the pad layer 14 of the protective layer. As illustrated in FIG. 7, the protective layer 110 is a sacrificial layer that is used to allow the gate electrodes 52 to include portions that extend above the primary surface 13 of the substrate 12. The elevational difference between the primary surface 13 and the uppermost part of the gate electrodes 52 is a function of the thicknesses of the protective layer 110 and the charge storage stack 48. In a particular embodiment, the elevational difference is more strongly affected by the thickness of the protective layer 110 because the charge storage stack 48 is substantially thinner than the protective layer 110.

As illustrated in the embodiment of FIG. 7, insulating layers 72 are formed over portions of the substrate 12 within the trenches 22 and over the mesas 32, and insulating layers 74 are formed along the exposed surfaces of the gate electrodes 52. The insulating layers 72 and 74 can include an oxide, a nitride, an oxynitride, or any combination thereof. The thickness of the insulating layers 72 acts as an implant screen during a subsequent ion implantation when forming source/drain ("S/D") regions. The insulating layer 74 helps to protect the gate electrodes 52 during subsequent processing. The insulating layers 72 and 74 can have a thickness in a range of approximately 5 to approximately 50 nm. The insulating layers 72 and 74 can have the same composition or different compositions and the same thickness or different thicknesses.

Different embodiments can be used in forming the insulating layers 72 and 74. In one embodiment, the insulating layers 72 and 74 are formed by thermally oxidizing or nitriding parts of the substrate 12 and the gate electrodes 52. In still another embodiment (not illustrated), an insulating layer may be deposited over the substrate 12 and gate electrodes 52, wherein the insulating layer is formed in place of or in conjunction with the insulating layers 72 and 74. The insulating layer has a composition and thickness as previously described for the insulating layers 72 and 74. Except as expressly recited herein, each of the insulating layers 72 and 74, and the deposited insulating layer is formed using a conventional or proprietary technique.

Figure 8:
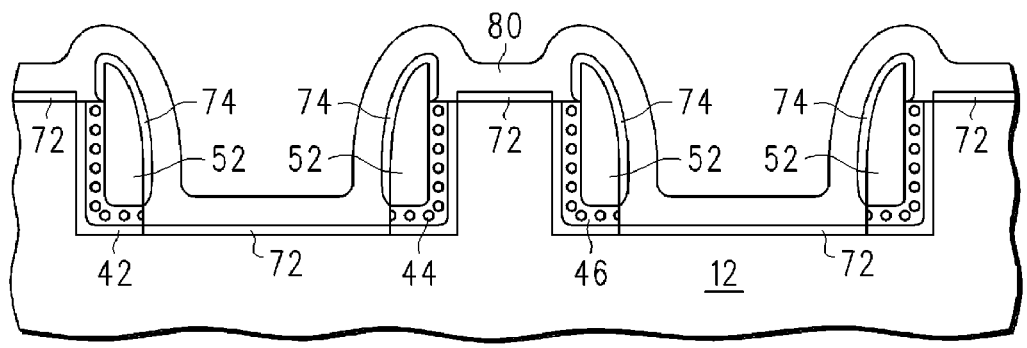
FIG. 8 includes an illustration of a cross-sectional view of a workpiece of FIGS. 6 and 7 after forming another layer of a gate electrode material.

Another layer of gate electrode material 80 is then formed overlying the workpiece and only partly fills remaining portions of the trenches 22, as illustrated in FIG. 8. The gate electrode material 80 can include any of the materials, thicknesses, and formation processes as described with respect to the gate electrode material 50. As compared to the gate electrode material 50, the gate electrode material 80 may have the same composition or different compositions, the same thickness, or different thicknesses, be formed using by repeating the same process technique or different process techniques, or any combination thereof.

Figure 9:
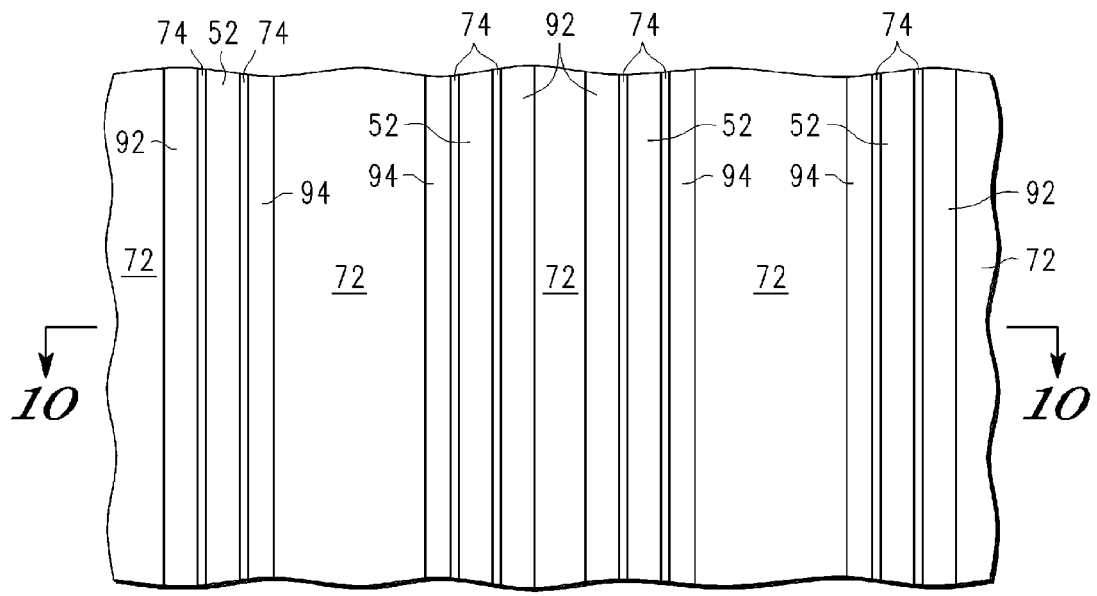
FIGS. 9 and 10 include illustrations of a top view and a cross-sectional view, respectively, of the workpiece of FIG. 8 after forming additional gate electrodes.
Figure 10:
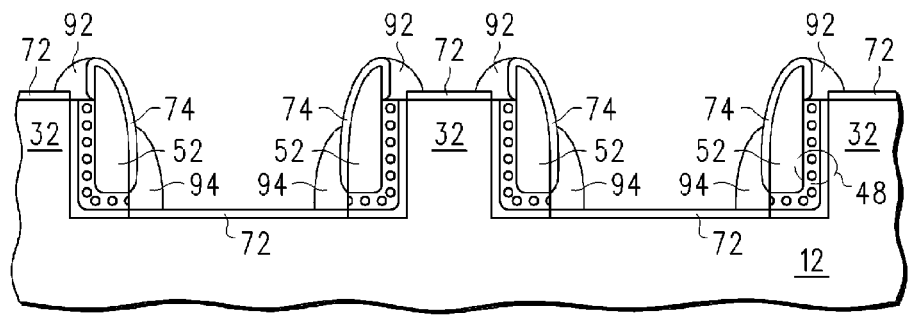

FIGS. 9 and 10 include illustrations of a top view and a cross-sectional view, respectively, after the gate electrode material 80 has been etched to form gate electrodes 92 and 94. In one embodiment, an anisotropic etch is performed to remove portions of gate electrode material 80 overlying portions of the mesas 32 and the bottoms of the trenches 22. In FIG. 9, each gate electrode 52 has a gate electrode 92 along one side and a gate electrode 94 along the opposite side. In the embodiment illustrated in FIGS. 9 and 10, the gate electrodes 92 lie outside the trenches 22 and overlie the mesas 32 and the primary surface 13, and the gate electrodes 94 overlie the bottoms of the trenches 22.

In one embodiment, the gate electrodes 92 and 94 are in the form of sidewall spacers and have an arc-shaped outer surface, although other shapes can be used in other embodiments. In one embodiment, the bases of the gate electrodes 92 and 94 have widths that are approximately the same as the thickness of the gate electrode material as deposited. In another embodiment, the bases have widths that are at least half of the thickness of the gate electrode material as deposited. In a particular embodiment, each of the bases of the gate electrodes 92 are in a range of approximately 50 to approximately 90 nm wide. The etching chemistry and other etching parameters can use conventional or proprietary etching chemistries and etching parameters used for etching gate electrode materials. Although not illustrated, a mask and etch process sequence can be used to separate the gate electrodes 94 at the end of the trenches 22, so that the gate electrodes 94 lying adjacent to opposite sides of the trenches 22 are not electrically shorted to each other.

Figure 11:
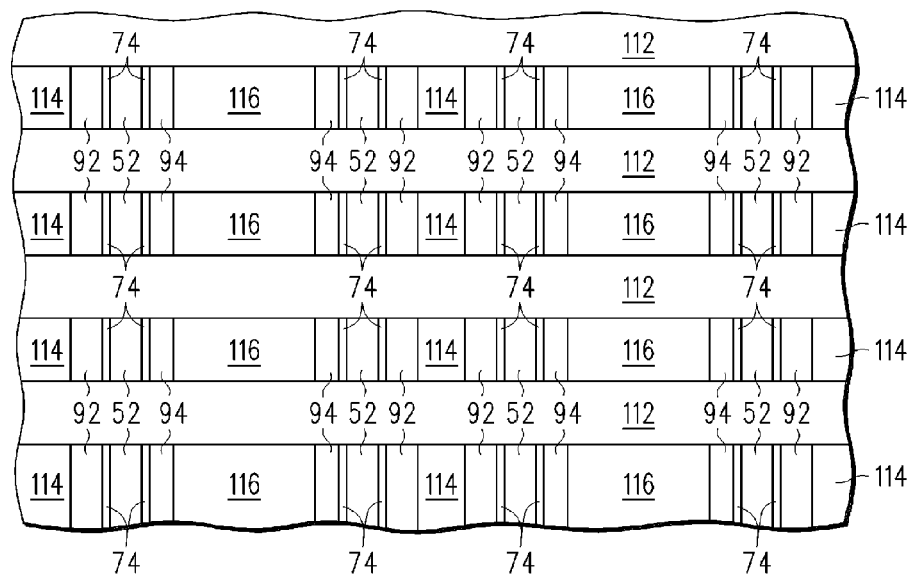
FIG. 11 includes an illustration of a top view of the workpiece of FIGS. 9 and 10 after selectively doping portions of the substrate within the mesas and under bottoms of the trenches.
Figure 12:
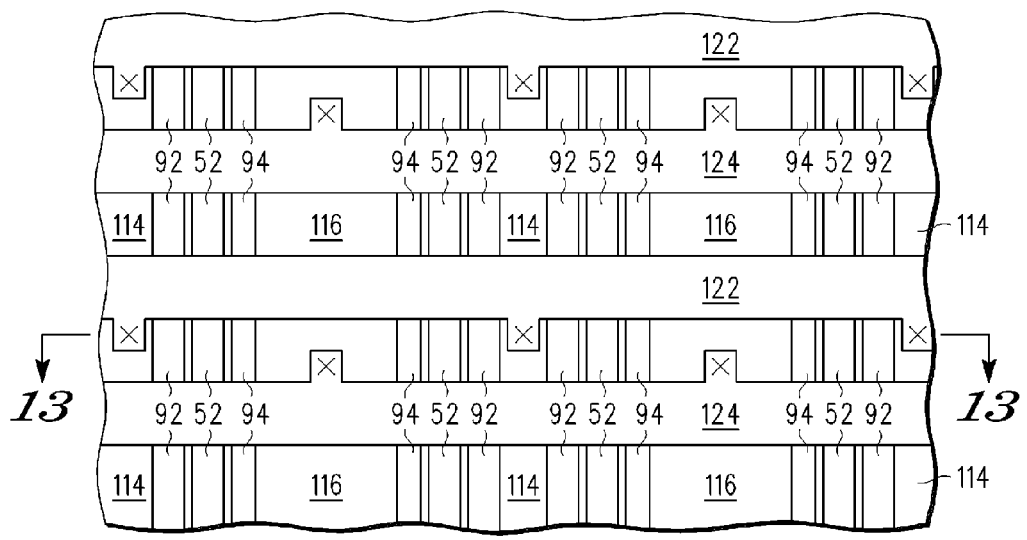
FIGS. 12 and 13 include illustrations of a top view and a cross-sectional view, respectively, of the workpiece of FIG. 11 after forming a substantially completed electronic device.
Figure 13:
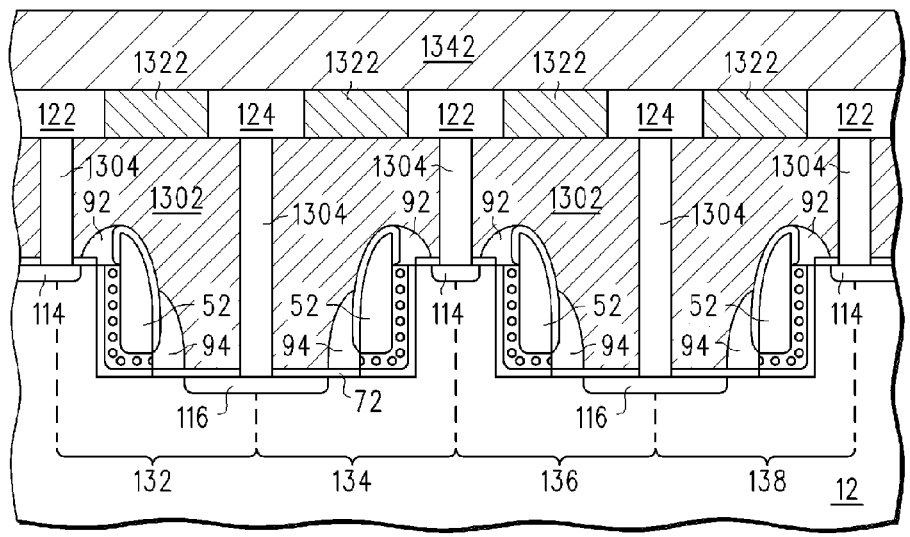

A variety of different layouts for the source/drain ("S/D") regions and bit line can be used. FIGS. 11 to 13 include a layout in which portions of the substrate 12 adjacent to the gate electrodes 92 and other portions of the substrate 12 adjacent to the gate electrodes are doped, and bit lines are oriented substantially perpendicular to the gate lines. Referring to FIG. 11, a masking layer is formed over the array and includes masking members 112 and openings between the masking members 112. The masking members 112 are oriented substantially perpendicular to the gate members 52, 92, and 94. A dopant is introduced into portions of the substrate between the masking members 112 to form doped regions 114 and 116. The doped regions 114 include portions of the substrate 12 within the mesas 32, and the doped regions 116 include portions of the substrate 12 below the bottoms 34 of the trenches 22. In one embodiment, the doped regions 114 and 116 can act as S/D regions. The dopant may be a p-type dopant (e.g., boron) or an n-type dopant (e.g., phosphorus or arsenic). In one embodiment, the dopant can be introduced using ion implantation. The masking members 112 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of the doped regions 114 and 116 has a dopant concentration of at least approximately $1E19$ atoms/$cm^3$. The formation of the masking members 112, their subsequent removal, and doping to form the doped regions 114 and 116 are performed using conventional of proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 12 and 13 include illustrations of a top view and a cross-sectional view, respectively, of a substantially completed electronic device. FIG. 12 does not illustrate the insulating layers formed after forming the doped regions 114 and 116 to simplify understanding of the positional relationships between the conductive members (e.g., gate electrodes, doped regions, conductive lines, etc.) of the electronic device. FIG. 12 includes conductive lines 122 and 124 that are oriented substantially perpendicular to the gate electrodes 52, 92, and 94. In one embodiment, the conductive lines 122 and 124 are bit lines. The conductive lines 122 are electrically connected to the doped regions 114 (within the mesas 32), and the conductive lines 124 are electrically connected to the doped regions 116 (below the bottoms of the trenches 22).

FIG. 13 includes a cross-sectional view at sectioning line 13-13 in FIG. 12. The process is described with respect to FIG. 13. An interlevel dielectric layer 1302 is formed over the workpiece by a conventional or proprietary technique. The interlevel dielectric layer 1302 is patterned to form contact openings that extend to doped regions 114 and 116 and to other portions of NVM array 18 that are not illustrated in FIGS. 12 and 13. The interlevel dielectric layer 1302 can include an insulating material, such as an oxide, a nitride, an oxynitride, or a combination thereof. In a specific embodiment, an anisotropic etch can be used to form contact openings.

Conductive plugs 1304 and the conductive lines 122 and 124 are then formed. The conductive plugs 1304 and the conductive lines 122 and 124 can include the same or different conducting materials. Each of the conductive plugs 1304 and the conductive lines 122 and 124 can include doped silicon, tungsten, titanium, tantalum, titanium nitride, tantalum nitride, aluminum, copper, another suitable conductive material, or any combination thereof. In one particular embodiment, the conductive plugs 1304 include tungsten, and the conductive lines 122 and 124 include copper. An optional barrier layer, adhesion layer, or any combination thereof may be formed before the corresponding conductive layers (e.g., tungsten for the conductive plugs 1304 and copper for the conductive lines 122 and 124). An optional capping layer (e.g., a metal-containing nitride) may be used to encapsulate copper within the conductive lines 122 and 124.

In one embodiment, the conductive plugs 1304 are formed before the conductive lines 122 and 124. In one particular embodiment, a conductive layer (not illustrated) is formed over interlevel dielectric layer 1302 and substantially fills contact openings therein. Portions of the conductive layer that lie outside the contact openings are removed to form the conductive plugs 1304. In one embodiment, a conventional or proprietary chemical-mechanical polishing operation can be performed, and in another embodiment, a conventional or proprietary etching process can be performed.

Another insulating layer 1322 is then deposited and patterned to form interconnect trenches where the conductive lines 122 and 124 are formed. Other interconnect trenches can be formed at locations within the NVM array 18, outside the NVM array 18, or any combination thereof. In one embodiment, another conductive layer is formed over the interlevel dielectric layer 1302 and substantially fills the interconnect trenches in the insulating layer 1322. Portions of the conductive layer that lie outside the interconnect trenches within the insulating layer 1322 are removed to form the conductive lines 122 and 124. In one embodiment, a conventional or proprietary chemical-mechanical polishing operation can be performed, and in another embodiment, a conventional or proprietary etching process can be performed. The insulating layer 1322 lies at substantially the same elevation as and between the conductive lines 122 and 124. In another embodiment (not illustrated), the conductive plugs 1302 and the conductive lines 122 and 124 are formed concurrently using a conventional or proprietary dual-inlaid process.

In another embodiment (not illustrated), additional insulating and conductive layers can be formed and patterned to form one or more additional levels of interconnects. After the last interconnect level has been formed, an encapsulating layer 1342 is formed over substrate 12, including the NVM array 18 and peripheral areas. The encapsulating layer 1342 can include one or more insulating film, such as an oxide, a nitride, an oxynitride, or a combination thereof. The NVM array 18 includes memory cells 132, 134, 136, and 138, each of which is a three-transistor memory cell.

Figure 14:
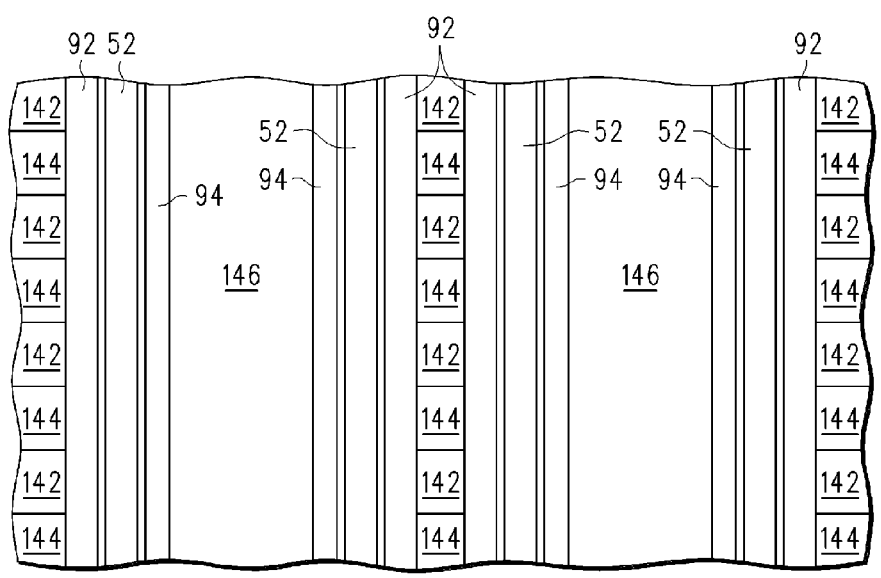
FIG. 14 includes an illustration of a top view of the workpiece of FIGS. 9 and 10 after selectively doping portions of the substrate within the mesas and under bottoms of the trenches in accordance with an alternative embodiment.
Figure 15:
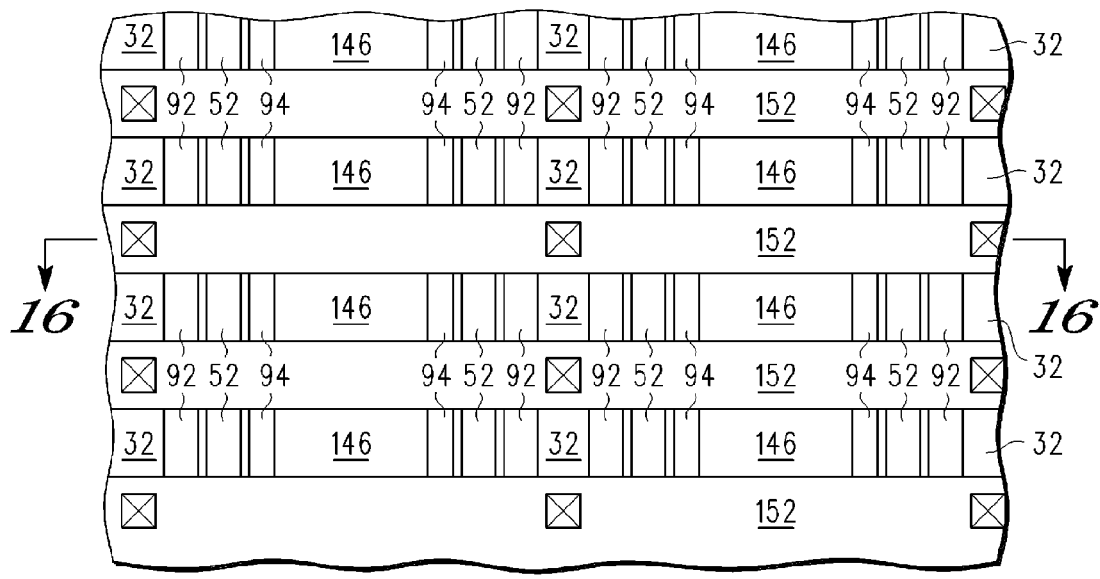
FIGS. 15 and 16 include illustrations of a top view and a cross-sectional view, respectively, of the workpiece of FIG. 14 after forming a substantially completed electronic device in accordance with the alternative embodiment.
Figure 16:
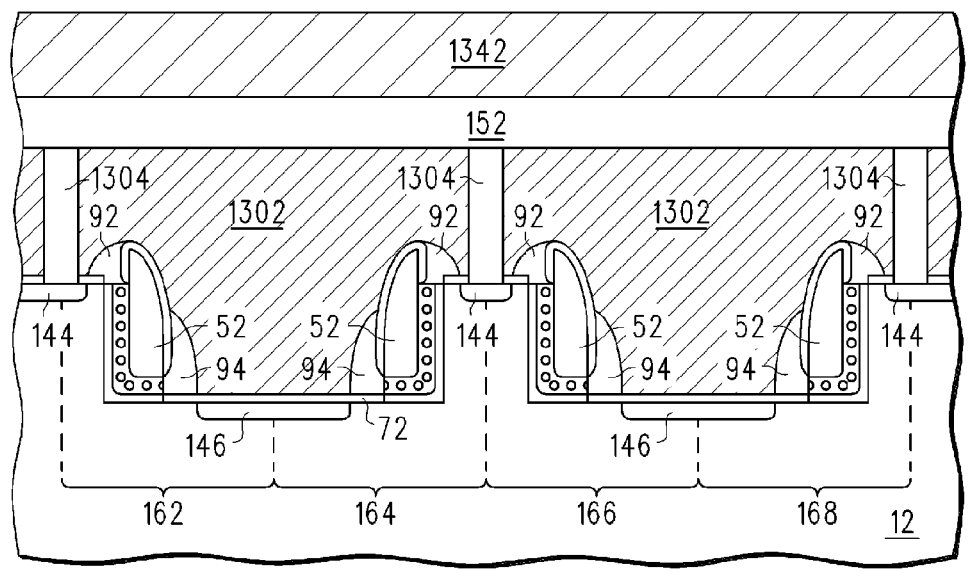

FIGS. 14 to 16 illustrate another embodiment having a different layout for the source/drain ("S/D") regions and bit lines. FIGS. 14 to 16 include a layout in which portions of the substrate 12 adjacent to the gate electrodes 92 and other portions of the substrate 12 adjacent to the gate electrodes 94 are doped, and other bit lines are oriented substantially parallel to the gate electrodes 52, 92, and 94. In this embodiment, the process through formation of the gate electrodes 92 and 94 (FIGS. 9 and 10) can be performed using any embodiment as previously described with respect to FIGS. 1 to 10.

Referring to FIG. 14, a masking layer is formed over the array and includes masking members 142 and openings between the masking members 142. As illustrated, the masking members 142 cover portions of the mesas 32, and in another embodiment, the masking members 142 can cover portions of the gate electrodes 52, 92, and 94 but do not cover portions of the substrate 12 that lie under the bottoms 34 of the trenches 22 and between the gate electrodes 94. A dopant is introduced into portions of the substrate 12 to form doped regions 144 and 146. The doped regions 144 include portions of the substrate 12 within the mesas 32, and the doped regions 146 include portions of the substrate 12 below the bottoms of the trenches 22. In one embodiment, the doped regions 144 and 146 can act as S/D regions. In the illustrated embodiment, the doped region 146 is oriented substantially parallel to the gate electrodes 52, 92, and 94 and acts as a bit line. The dopant may be a p-type dopant (e.g., boron) or an n-type dopant (e.g., phosphorus or arsenic). In one embodiment, the dopant can be introduced using ion implantation. The masking members 142 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of doped regions 144 and 146 has a dopant concentration of at least approximately 1E19 atoms/cm$^3$. The formation of the masking members 142, their subsequent removal, and doping to form the doped regions 144 and 146 are performed using conventional of proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 15 and 16 include illustrations of a top view and a cross-sectional view, respectively, of a substantially completed electronic device. FIG. 15 does not illustrate the insulating layers after forming the doped regions 144 and 146 to simplify understanding of the positional relationships between the conductive members (e.g., gate electrodes, doped regions, conductive lines, etc.) of the electronic device. FIG. 15 includes conductive lines 152 that are oriented substantially perpendicular to the doped regions 146 and the gate electrodes 52, 92, and 94. In one embodiment, the conductive lines 152 are bit lines. The conductive lines 152 are electrically connected to the doped regions 144 (within the mesas 32). Portions of the mesas 32 that were not doped when forming the doped regions 144 are illustrated as mesas 32 in FIG. 15.

FIG. 16 includes a cross-sectional view at sectioning line 16-16 in FIG. 15. The process is described with respect to FIG. 16. The process of forming the interlevel dielectric layer 1302, conductive plugs 1304, and insulating layer 1322 (not illustrated) are formed using any of the embodiments described with respect to FIGS. 12 and 13. The insulating layer 1322 is patterned to form interconnect trenches. Referring to FIG. 15, the remaining portions (not illustrated) of the insulating layer 1322 lie between the conductive lines 152, and the interconnect trenches lie where the conductive lines 152 are to be formed.

The conductive lines 152 are then formed. The conductive lines 152 can include any of the materials as previously described with respect to the conductive plugs 1304 and the conductive lines 122 and 124. More particularly, after the insulating layer 1322 is then deposited and patterned to form interconnect trenches, a conductive layer is formed over the interlevel dielectric layer 1302 and substantially fills the interconnect trenches in the insulating layer 1322. Portions of the conductive layer that lie outside the interconnect trenches within the insulating layer 1322 are removed to form the conductive lines 152. In one embodiment, a conventional or proprietary chemical-mechanical polishing operation can be performed, and in another embodiment, a conventional or proprietary etching process can be performed. The insulating layer 1322 lies at substantially the same elevation as and between the conductive lines 152. In another embodiment (not illustrated), the conductive plugs 1302 and the conductive lines 152 are formed concurrently using a conventional or proprietary dual-inlaid process.

In another embodiment (not illustrated), additional insulating and conductive layers can be formed and patterned to form one or more additional levels of interconnects. After the last interconnect level has been formed, the encapsulating layer 1342 is formed over substrate 12, including the NVM array 18 and peripheral areas. The NVM array 18 includes memory cells 162, 164, 166, and 168, each of which is a three-transistor memory cell.

Another layout can be used in another embodiment (not illustrated). The masking, doping, and bit line orientations described with respect to FIGS. 14 to 16 can be reversed. The doped regions 144 can be continuous along the trenches, and the doped regions 146 can be segmented. The conductive lines 152 would be electrically connected to the doped regions 146, rather than the doped regions 144.

Figure 17:
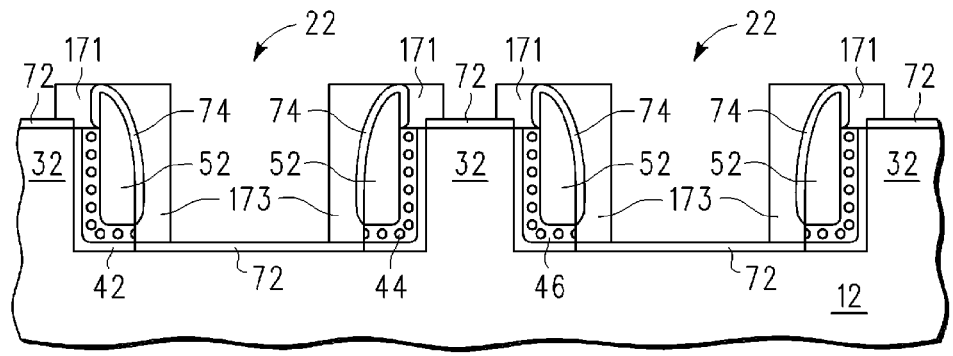
FIGS. 17 through 21 include illustrations of the workpiece when forming buried bit lines and gate electrodes, wherein the some of the gate electrode are electrically connected to a gate line in accordance with an alternative embodiment.

In yet another layout as illustrated in FIGS. 17 to 21, a spacer including a gate electrode material can be segmented into a plurality of gate electrodes to allow word lines, select lines, or other gate lines to be oriented substantially perpendicular to the trenches 22. A workpiece is processed using any of the embodiments as described with respect to FIGS. 1 to 8. The gate electrode material 80 (in FIG. 8) is etched to form sidewall spacers 171 and 173, as illustrated in FIG. 17. In this embodiment, the sidewall spacers 171 and 173 have more of a squared-off shape as compared to the gate electrodes 92 and 94 in FIG. 9. The etch is performed so that the insulating layers 74 between the sidewall spacers 171 and 173 are exposed, so that the sidewall spacers 171 and 173 are not electrically connected to each other. The sidewall spacers 171 and 173 are formed using a conventional or proprietary processing technique. In a particular embodiment, the sidewall spacers 171 and 173 extend along substantially all of the lengths of the trenches 22.

Figure 18:
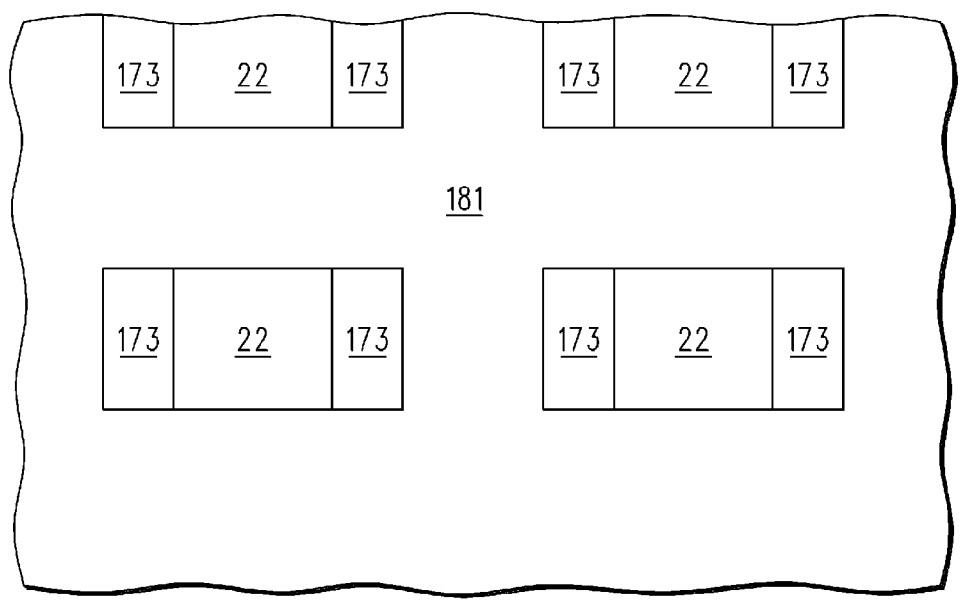

FIG. 18 includes an illustration of a top view after forming a patterned masking layer over the workpiece. A masking layer is deposited and patterned to define a masking member 181. In this embodiment, the masking member 181 covers the sidewall spacers 171 and portions of the sidewall spacers 173. In an alternative embodiment, the masking member covers the sidewall spacers 173 and portions of the sidewall spacers 173. In the embodiment as illustrated in FIG. 18, the exposed portions of the sidewall spacers 173 are etched. The sidewall spacer etch is selective to insulating layers. Therefore, the insulating layers 72 protect portions of the substrate 12 within the mesas 32 when the sidewall spacers 173 are etched. The masking member 181 is then removed. The patterned masking layer formation, sidewall spacer etch, and patterned masking layer removal are performed using convention or proprietary processing operations.

Figure 19:
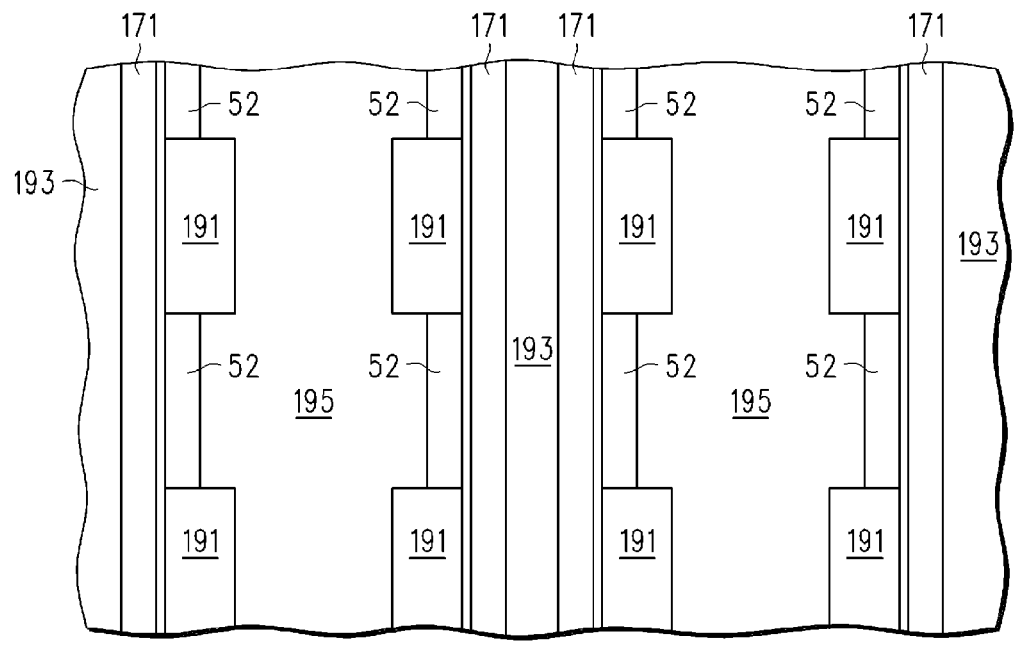

FIG. 19 includes sidewall spacers 171, which act as gate electrodes, and gate electrodes 191, which are remaining portions of the sidewall spacers 173. In this embodiment, the gate electrodes 52 act as control gate electrodes, and the sidewall spacers 171 and gate electrodes 191 act as select gate electrodes. The gate electrodes 52 and sidewall spacers 171 are substantially continuous along the walls of the trenches, and portions of the gate electrodes 52 are covered by the gate electrodes 191. Doped regions 193 are formed within the mesas 32, and doped regions 195 are formed along the bottoms of the trenches 22. The doped regions 193 and the doped regions 195 act as source/drain regions and are formed using an embodiment previous described. The trenches 22, the gate electrodes 52, the sidewall spacers 171, the doped regions 193, and the doped regions 195 are oriented substantially along the same direction.

Figure 20:
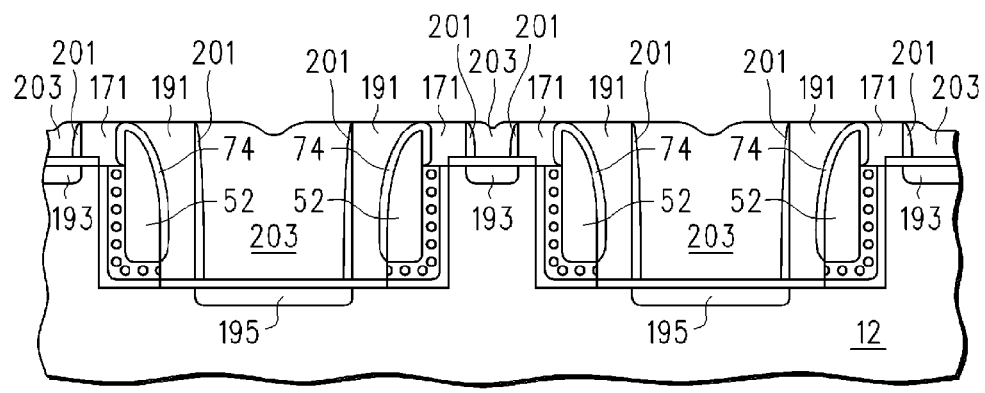

FIG. 20 includes an illustration of the workpiece after forming insulating spacers 201 and 203. In one embodiment, the insulating spacers 201 and 203 include different material and are formed when forming spacer structures in the logic regions (outside the NVM array 18). The insulating spacers 201 can include an oxide, and the insulating spacers 203 can include a nitride. As illustrated, the two sides of the insulating spacers 203 merge in the middle of the trench 22. If the merge does not occur, a dep-etch-dep process can be formed that preferentially fills in the lowest exposed portions of the trenches, while not forming a significant amount of nitride over the sidewall spacers 171, the source/drain regions 193, the gate electrodes 191, or any combination thereof. The insulating spacers 201 and 203 are formed using a conventional or proprietary processing sequence.

Figure 21:
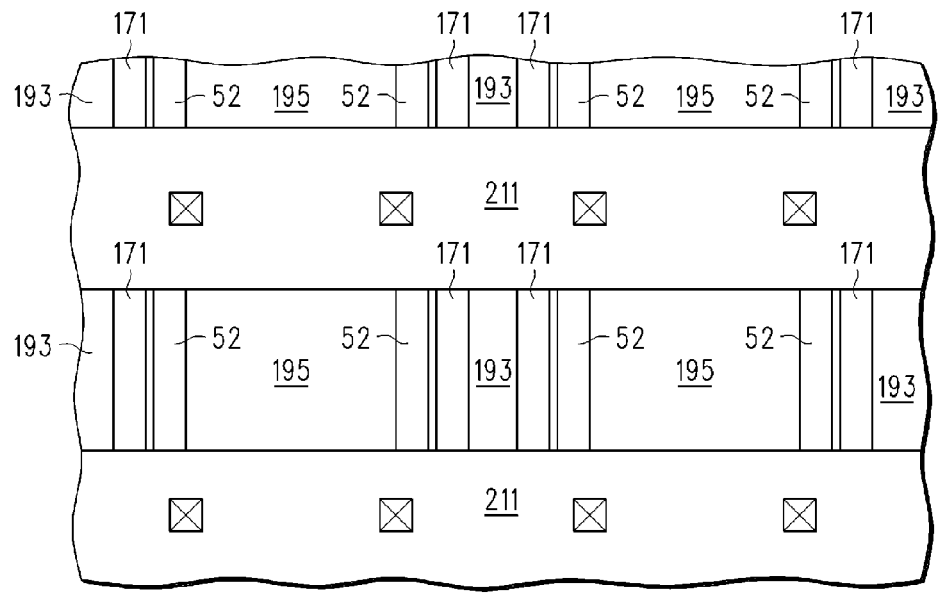

FIG. 21 includes an illustration of top view of a substantially completed electronic device. Gate lines 211 are formed and are electrically connected to the gate electrodes 193 (not illustrated in FIG. 21) that underlie the gate lines 211. In a particular embodiment, the gate lines 211 act as select gate lines. The gate lines 211 are oriented substantially perpendicular to the trenches 22, the gate electrodes 52, the sidewall spacers 171, the doped regions 193, the doped regions 195, or any combination thereof. The remaining processing to form the substantially completed electronic device can using any embodiment as described with respect to FIGS. 12 and 13.

Still other layouts can be used but are not illustrated. For example, buried bit lines can be used both within the trenches and outside the trenches. Doped regions within the substrate 12 can extend along the length of the trenches. Spaced-apart field isolation regions can be formed along the bottoms of the trenches 22 before forming the gate electrodes 52 or 92. When forming the doped regions for the S/D regions, as previously described, the spaced-apart field isolation regions help to form a plurality of spaced-apart doped regions along the bottoms of those trenches that include the spaced-apart field isolation regions. Appropriate bit line contacts can then be made to those spaced-apart doped regions.

In another example (not illustrated), buried bit lines can be formed within the substrate 12, underlie the trenches 22 and be spaced apart from the bottoms 34 of the trenches 22. The buried bit lines would be oriented substantially perpendicular to the trenches 22, similar to the orientation of the conductive lines 152 in FIG. 15. After forming the buried bit lines, a semiconductor layer can be epitaxial grown over the buried bit lines and have a thickness that is greater than the depth of the trenches. The semiconductor layer can be formed using a conventional or proprietary technique. Trenches are formed using an embodiment previously described. The bottoms 34 of the trenches 22 are spaced apart from the buried bit lines by portions of the semiconductor layer. After forming the trenches 22 and the gate electrodes 62, a masking layer is formed with masking members within the then be formed within the trenches 22. The pattern would be similar to the masking layer described with respect to FIG. 14, except that the masking members would lie within the trenches 22 and would not overlie the mesas 32. Doping would be performed similar to forming the doped regions 144 and 146 in FIG. 14. The doped regions 146 extend to the buried bit lines to form an electrical connection. However, the doped regions 144 are spaced apart from the buried bit lines, and therefore, the doped regions 144 are not electrically connected to the buried bit lines below the trenches 22. In this particular embodiment, a contactless array can be formed. After reading this specification, skilled artisans will appreciate that still other layouts can be used.

Figure 22:
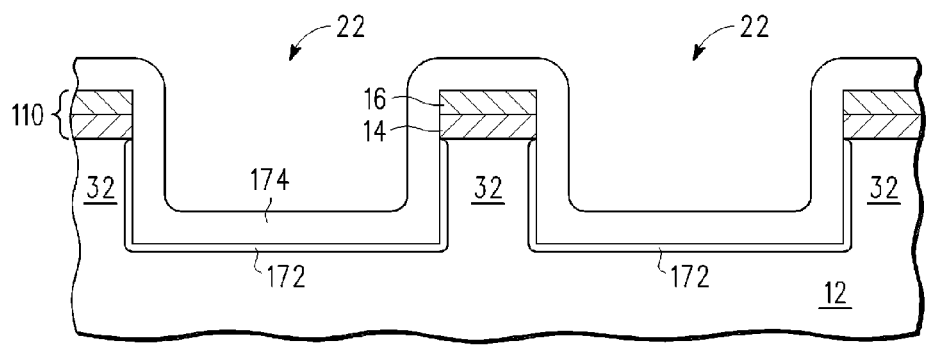
FIG. 22 includes an illustration of a cross-sectional view of a workpiece of FIGS. 2 and 3 after forming a dielectric layer and a layer of a gate electrode material.

FIGS. 22 to 25 illustrate another embodiment in which the location of the discontinuous storage elements is different. In this embodiment, the process through formation of the trenches 22 can be performed using any embodiment as previously described with respect to FIGS. 1 to 3. A dielectric layer 172 can be formed along the exposed portions of the trenches 22, as illustrated in FIG. 22. The dielectric layer 172 can be formed using any of the materials, thicknesses, and formation techniques as described with respect to the dielectric layer 42. A gate electrode material 174 is then formed overlying the workpiece and only partly fills remaining portions of the trenches 22, as illustrated in FIG. 22. The gate electrode material 174 can be formed using any of the materials, thicknesses, and formation techniques as described with respect to the gate electrode material 50.

Figure 23:
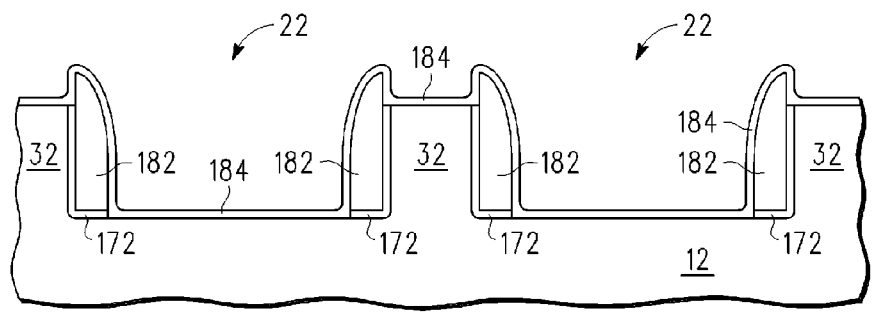
FIG. 23 includes an illustration of a cross-sectional view of a workpiece of FIG. 22 after forming gate electrodes and an insulating layer on exposed surfaces of the substrate and gate electrodes.

FIG. 23 includes an illustrations of a cross-sectional view after the gate electrode material 174 has been etched to form gate electrodes 182. The gate electrodes 182 can be formed using any of the previously described embodiments with respect to the gate electrodes 62. Remaining portions of the protective layer 110 (not illustrated in FIG. 23) are then removed using a conventional or proprietary technique. A dielectric layer 184 is then formed over portions of the substrate 12 within the trenches 22 and over the mesas 32, and along the exposed surfaces of the gate electrodes 182. The dielectric layer 184 can be formed using any of the materials and formation techniques as described with respect to the insulating layer 72 or 74. The dielectric layer 182 has a thickness in a range of approximately 1 to approximately 9 nm overlying the mesas 32 and portions of the bottoms of the trenches 22.

Figure 24:
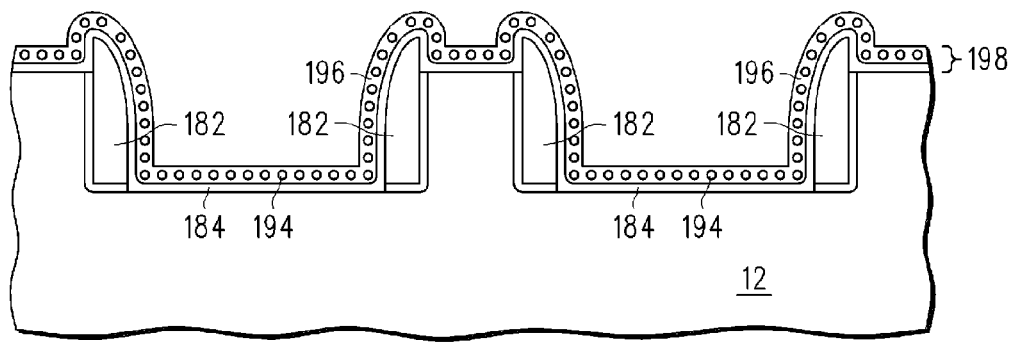
FIG. 24 includes an illustration of a cross-sectional view of a workpiece of FIG. 23 after forming a charge storage stack.

FIG. 24 includes an illustration of a cross-sectional view of the workpiece after forming the remainder of the charge storage stack 198. Discontinuous storage elements 194 are formed over NVM array 18. The discontinuous storage elements 194 can be formed using any of the materials, thicknesses, and formation techniques as described with respect to the discontinuous storage elements 44. A dielectric layer 196 is then formed over the discontinuous storage elements 194. The dielectric layer 196 can be formed using any of the materials, thicknesses, and formation techniques as described with respect to the dielectric layer 46. The charge storage stack includes the dielectric layer 184, the discontinuous storage elements 194, and the dielectric layer 196.

In one embodiment, portions of the discontinuous storage elements 194 lying along substantially vertical or more highly sloped surfaces (e.g., along the lower portions of the gate electrodes 182 within the trenches) are removed. In a particular embodiment, a material different from the dielectric layer 184, the dielectric layer 196, or both can be formed substantially thicker along substantially horizontal surfaces, as opposed to substantially horizontal surfaces. Different physical vapor or chemical vapor deposition techniques can be used. In a more particular embodiment, the dielectric layers 184 and 196 can include oxide, and a nitride layer (not illustrated) can be deposited using a collimated sputtering technique. An isotropic nitride etchant can remove the nitride layer along the substantially vertical or more highly sloped surfaces, while leaving remaining portions of the nitride layer overlying the substantially horizontal or less highly sloped surfaces. An isotropic oxide etchant can remove exposed portions of the dielectric layer 184 and the dielectric layer 196, while other portions of the charge storage stack 198 are protected by remaining portions of the nitride layer. After the isotropic oxide etch, the remaining portions of the nitride layer can remain or be removed. At the end of this process sequence, some of the discontinuous storage elements 194 may remain over the higher locations of the gate electrodes 182 (not illustrated), however such discontinuous storage elements 194 will not adversely affect the performance of the electronic device. In another embodiment (not illustrated), the selective removal process previously described can be omitted, and the charge storage stack 198 can remain along all exposed surfaces.

Figure 25:
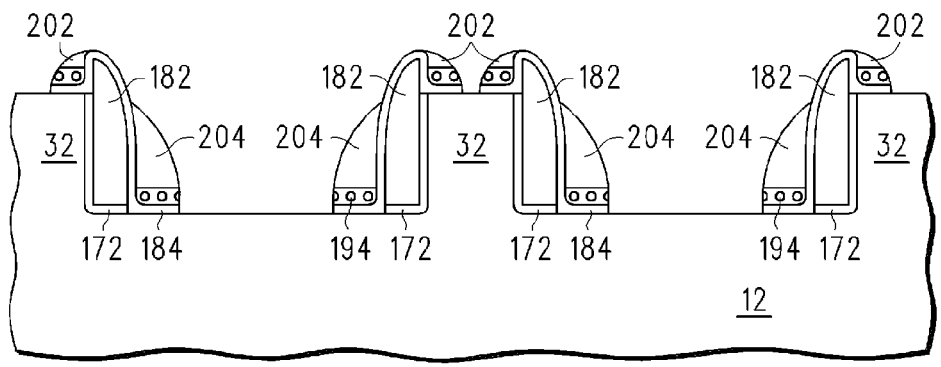
FIG. 25 include illustrations of a cross-sectional view of the workpiece of FIG. 24 after forming additional gate electrodes and removing exposed portions of the charge storage stack.

A gate electrode material is deposited over the workpiece and etched to form gate electrodes 202 and 204, as illustrated in FIG. 25. The gate electrode material and gate electrodes 202 and 204 can be formed using any of the materials, thicknesses, and formation techniques as described with respect to the gate electrode material 50 and the gate electrode 92 and 94. Although not illustrated, the process flow can be continued with the formation of doped regions, insulating layers, conductive plugs, conductive lines, and passivation layers using any one or more embodiments as previously described.

The NVM array 18 can include memory cells using any of the layouts as previously described. Circuit schematics and cross references to physical embodiments are described to illustrate better how memory cells within NVM array 18 can be electrically configured and used.

Figure 26:
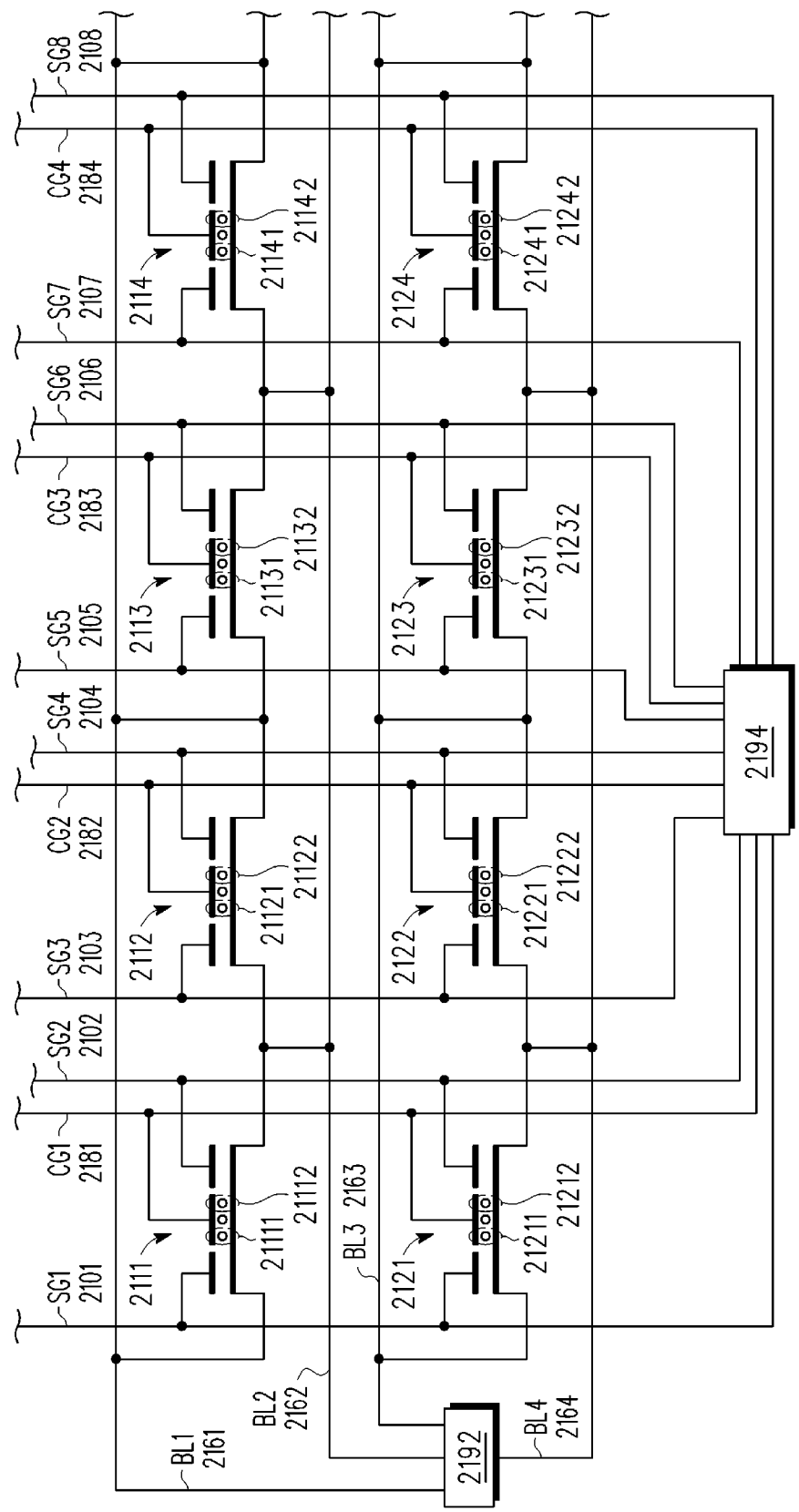
Figure 27:
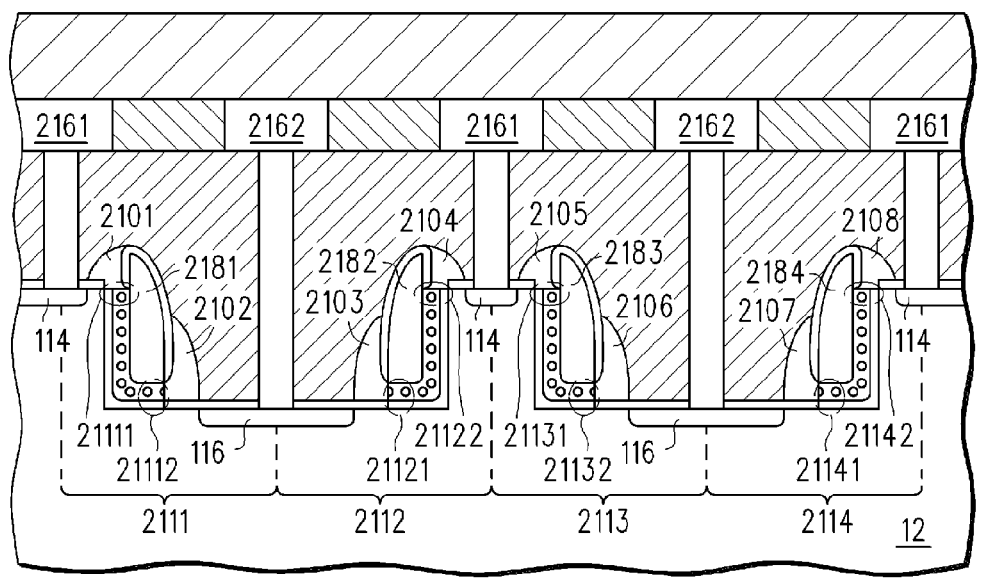

FIG. 26 includes a circuit schematic for an embodiment as described with respect to the embodiment as illustrated in FIG. 27. Memory cells 2111, 2112, 2113, 2114, 2121, 2122, 2123, and 2124 are oriented within the NVM array 18, as illustrated in FIG. 26.

Referring to FIG. 26, BL1 2161 is electrically connected to S/D regions of the memory cells 2111, 2112, 2113, and 2114, and BL2 2162 is electrically connected to the other S/D region of the memory cells 2111, 2112, 2113, and 2114. BL3 2163 is electrically connected to S/D regions of the memory cells 2121, 2122, 2123, and 2124, and BL4 2164 is electrically connected to the other S/D region of the memory cells 2121, 2122, 2123, and 2124.

SG1 2101 is electrically connected to select gate electrodes of the memory cells 2111 and 2121, CG1 2181 is electrically connected to control gate electrodes of the memory cells 2111 and 2121, and SG2 2102 is electrically connected to other select gate electrodes of the memory cells 2111 and 2121. SG3 2103 is electrically connected to select gate electrodes of the memory cells 2112 and 2122, CG2 2182 is electrically connected to control gate electrodes of the memory cells 2112 and 2122, and SG4 2104 is electrically connected to other select gate electrodes of the memory cells 2112 and 2122. SG5 2105 is electrically connected to select gate electrodes of the memory cells 2113 and 2123, CG3 2183 is electrically connected to control gate electrodes of the memory cells 2113 and 2123, and SG6 2106 is electrically connected to other select gate electrodes of the memory cells 2113 and 2123. SG7 2107 is electrically connected to select gate electrodes of the memory cells 2114 and 2124, CG4 2184 is electrically connected to control gate electrodes of the memory cells 2114 and 2124, and SG8 2108 is electrically connected to other select gate electrodes of the memory cells 2114 and 2124.

A bit line control module 2192 is coupled to BL1 2161, BL2 2162, and BL3 2163, and BL4, 2164. A gate line control module 2194 is coupled to SG1 2101, CG1 2181, SG2 2102, SG2 2102, CG2 2182, SG3 2103, SG4 2104, CG3 2183, SG6 2106, SG7 2107, CG4 2184, and SG8 2108. Each of the bit line control module 2192 and the gate line control module 2194 are conventional or proprietary and may include row or column decoders, voltage drivers, other suitable circuits to operate the NVM array 18, or any combination thereof. Each of the bit line control module 2192 and the gate line control module 2194 can include more than one control module. Each of the bit line control module 2192 and the gate line control module 2194 can the bit lines to be biased or electrically float to achieve the proper operation of the NVM array 18.

FIG. 27 illustrates a physical embodiment of a portion of the NVM array 18 corresponding to the row that includes the memory cells 2111, 2112, 2113, and 2114. FIG. 27 is substantially the same as FIG. 13 except that reference numbers as used in the circuit schematics are used in FIG. 27.

Charge storage regions for the memory cells 2111 and 2112 are illustrated in FIGS. 26 and 27. The memory cell 2111 includes charge storage regions 21111 and 21112, the memory cell 2112 includes charge storage regions 21121 and 21122, the memory cell 2113 includes charge storage regions includes charge storage regions 21131 and 21132, and the memory cell 2114 includes charge storage regions 21141 and 21142. The memory cells 2121 to 2124 include similar charge storage regions to the memory cells 2111 to 2114, respectively, but are not illustrated in FIG. 27.

FIG. 28 includes a table that has some of the operating voltages for memory cells along the top row of memory cells, as illustrated in FIG. 26. When programming charge storage region 21111 in accordance with one embodiment, BL1 2161 and BL2 2162 are biased to allow electrons to flow from BL2 2161 to BL1 2161. Each of SG1 2101, CG1 2181, and SG2 2142 is biased to allow carriers to flow through the channel regions of memory cell 2111. All other select gate lines and control gate lines (e.g., SG3 2103, CG2 2182, etc.) are at approximately 0 volts, and BL3 2163 and BL4 2164 are allowed to electrically float. In another embodiment, BL3 2163 and BL4 2164 can be at substantially 0 volts. Referring to FIG. 27, the channel region of the memory cell 2111 allows electrons to flow between BL2 2162 and BL1 2161. The channel region of the memory cell 2111 is adjacent to SG1 2101, CG1 2181, and SG2 2102 and between doped regions 114 and 116. SG1 2101, CG1 2181, and SG1 2102 are biased to allow electrons to flow from the doped region 116 to the doped region 114. The electrical field generated in the channel region of the memory cell 2111 near the doped region 114 (via BL1 2161) and SG1 2101 is sufficient to generate hot carriers within the channel region of memory cell 2111 near doped region 114. At least some of the hot carriers are attracted to the discontinuous storage elements at the charge storage region 21111 near the junction formed near the doped region 114 within the substrate 12.

The charge storage region 21112 within the memory cell 2111 is not programmed because SG1 2101 and SG2 2102 are at substantially similar voltages, and CG1 2181 is at a significantly higher voltage. Memory cells 2112, 2113, 2114, and 2121 to 2124 are not programmed because the voltages on the other select gate lines and control gate lines are zero, and because BL3 2163 and BL4 2164 are electrically float or are at substantially the same voltage so that no current flows between those bit lines.

On a relative basis and when the substrate 12 (or associated well region therein) is biased to zero volts, when programming charge storage region 21111, the voltage difference between CG1 2181 and BL2 2162 is in a range of approximately one to two times higher than the voltage difference between BL1 2161 and BL2 2162, and the voltage differences between SG1 2181 and BL2 2162 and between SG2 2182 and BL2 2162 are less than the voltage difference between BL1 2161 and BL2 2162. In a particular embodiment, the voltage difference between CG1 2181 and BL2 2162 is greater than approximately 1.5 times the voltage difference between BL1 2161 and BL2 2162, and the voltage differences between SG1 2101 and BL2 2162 and between SG2 2182 and BL2 2162 are in a range of approximately 0.4 to 0.8 times the voltage difference between BL1 2161 and BL2 2162.

Charge storage region 21112 can be programmed using the voltages as listed in FIG. 28. As compared to charge storage region 21111, the voltages on BL1 2161 and BL2 2162 are reversed. The programming mechanism is substantially the same as described with respect to charge storage region 21111, except that the electrons flow through the channel from the doped region 114 (via BL1 2161) to the doped region 116 (via BL2 2162). The relative comparisons of the voltages described with respect to charge storage region 21111 are the same except that references to BL2 2162 are replaced by BL1 2161, and references to BL1 2161 are replaced by BL2 2162.

Regarding the other charge storage regions and memory cells, all charge storage regions for all the memory cells within the NVM array 18 are programmed using SSI. All other charge storage regions for memory cells 2112 to 2114 and 2121 to 2124 are similar to memory cell 2111. Each memory cell in FIG. 26 can store up to two bits of data.

Erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the control gate lines to approximately +7 volts, and allowing the bit lines to electrically float. Note that the voltages used for substrate 12 and the control gate lines do not need to be symmetric with respect to 0 volts. For example, a combination of −5 volts and +9 volts can be used. After reading this specification, skilled artisans will be able to determine a set of voltages to be used for erasing that meets their needs or desires.

The reading of data within NVM array 18 for memory cells 2111 to 2114 and 2121 to 2124 is given in FIG. 28. When reading datum at charge storage region 21111 of memory cell 2111, BL1 2161 and BL2 2162 are biased so that electrons flow from BL2 2162 to BL1 2161. SG1 2101 and CG1 2181 are biased to substantially the same voltage, and SG2 2102 is biased to a significantly higher voltage. In one particular embodiment, the voltage differences between SG1 2101 and BL2 2162 and between CG1 2181 and BL2 2162 are approximately 0.24 to 0.5 times the voltage difference between SG2 2102 and BL2 2162. A sense amplifier (not illustrated) coupled to the BL1 2161 or BL2 2162 will detect a higher level of current when the charge storage region 21111 is not programmed compared to when the charge storage region 21111 is programmed.

As compared to reading datum at charge storage region 21111, when reading datum at charge storage region 21112, the voltages on BL1 2162 and BL2 2164 are reversed, and the voltages on SG1 2101 and SG1 2102 are reversed. The relative comparisons of the voltages described with respect to charge storage region 21111 are the same except that references to BL1 2161 are replaced by BL2 2162, references to BL2 2162 are replaced by BL1 2161, references to SG1 2101 are replaced by SG2 2102, and references to SG2 2162 are replaced by SG1 2101. The reading of data at other charge storage regions with memory cells 2112 to 2114, and 2121 to 2124 can be performed in a similar manner.

Figure 29:
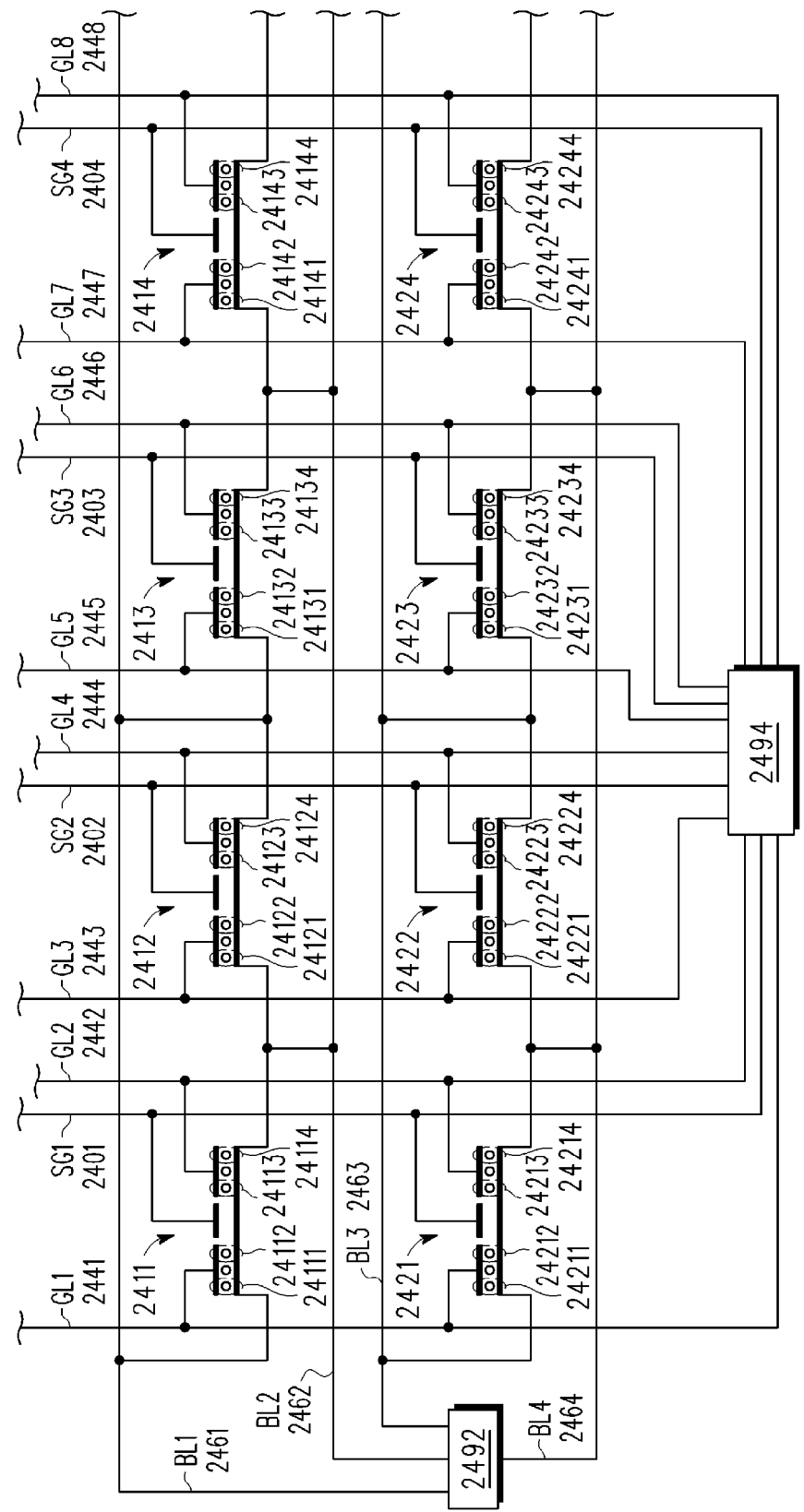
Figure 30:
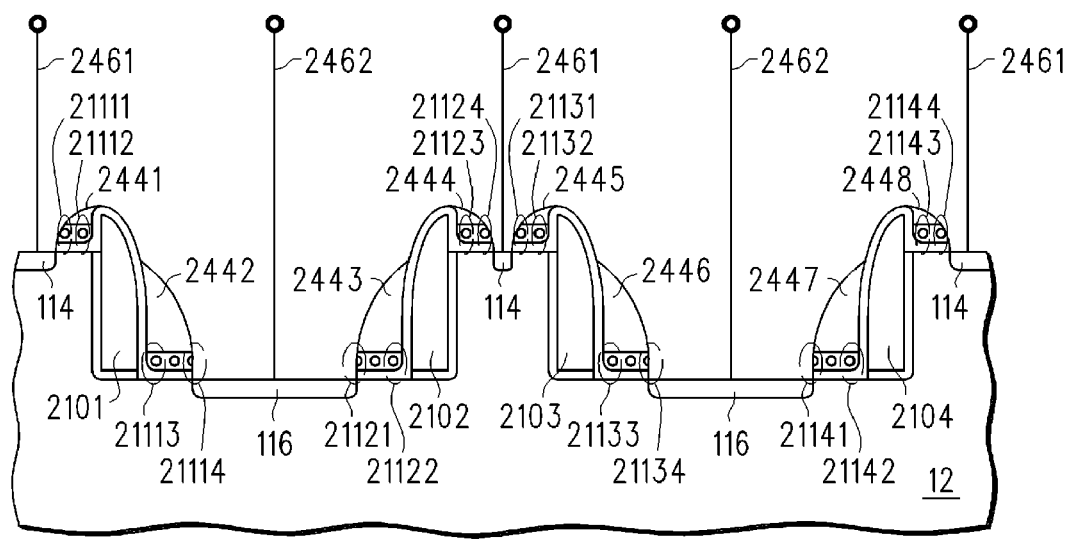

In another embodiment, each memory cell can include sets of discontinuous storage elements, as described with respect to FIGS. 22 to 25. FIG. 29 includes a circuit schematic for that embodiment and is described with respect to the embodiment as illustrated in FIG. 30. Memory cells 2411, 2412, 2413, 2414, 2421, 2422, 2423, and 2424 are oriented within the NVM array 18, as illustrated in FIG. 29.

Referring to FIG. 29, BL1 2461 is electrically connected to S/D regions of the memory cells 2411, 2412, 2413, and 2414, and BL2 2462 is electrically connected to the other S/D region of the memory cells 2411, 2412, 2413, and 2414. BL3 2463 is electrically connected to S/D regions of the memory cells 2421, 2422, 2423, and 2424, and BL4 2464 is electrically connected to the other S/D region of the memory cells 2421, 2422, 2423, and 2424.

GL1 2441 is electrically connected to gate electrodes of the memory cells 2411 and 2421, SG1 2401 is electrically connected to select gate electrodes of the memory cells 2411 and 2421, and GL2 2442 is electrically connected to other gate electrodes of the memory cells 2411 and 2421. GL3 2443 is electrically connected to gate electrodes of the memory cells 2412 and 2422, SG2 2402 is electrically connected to select gate electrodes of the memory cells 2412 and 2422, and GL4 2444 is electrically connected to other gate electrodes of the memory cells 2412 and 2422. GL5 2445 is electrically connected to gate electrodes of the memory cells 2413 and 2423, SG3 2403 is electrically connected to select gate electrodes of the memory cells 2413 and 2423, and GL6 2446 is electrically connected to other gate electrodes of the memory cells 2413 and 2423. GL7 2447 is electrically connected to gate electrodes of the memory cells 2414 and 2424, SG4 2404 is electrically connected to select gate electrodes of the memory cells 2414 and 2424, and GL8 2448 is electrically connected to other gate electrodes of the memory cells 2414 and 2424. Each of the gate electrodes connected to the gate lines (GL1 2141 to GL8 2148) can act as a control gate electrode under some biasing conditions and act as a select gate electrode under other biasing conditions.

A bit line control module 2492 is coupled to BL1 2461, BL2 2462, and BL3 2463, and BL4, 2464. A gate line control module 2494 is coupled to GL1 2441, SG1 2401, GL2 2442, GL2 2442, SG2 2402, GL3 2443, GL4 2444, SG3 2403, GL6 2446, GL7 2447, SG4 2404, and GL8 2448. Each of the bit line control module 2492 and the gate line control module 2494 are conventional or proprietary and may include row or column decoders, voltage drivers, other suitable circuits to operate the NVM array 18, or any combination thereof. Each of the bit line control module 2492 and the gate line control module 2494 can include more than one control module. Each of the bit line control module 2492 and the gate line control module 2494 can the bit lines to be biased or electrically float to achieve the proper operation of the NVM array 18.

FIG. 30 illustrates a physical embodiment of a portion of the NVM array 18 corresponding to the row that includes the memory cells 2411, 2412, 2413, and 2414.

Charge storage regions for the memory cells 2411 and 2412 are illustrated in FIGS. 29 and 30. The memory cell 2411 includes charge storage regions 24111, 24112, 24113, and 24114, the memory cell 2412 includes charge storage regions 24121 24122, 24123, and 24124, the memory cell 2413 includes charge storage regions includes charge storage regions 24131 24132, 24133, and 24134, and the memory cell 2414 includes charge storage regions 24141 24142, 24143, and 24144. The memory cells 2421 to 2424 include similar charge storage regions to the memory cells 2411 to 2414, respectively, but are not illustrated in FIG. 30.

FIGS. 31 and 32 include tables that have some of the operating voltages for memory cells along the top row of memory cells, as illustrated in FIG. 29. When programming charge storage region 24111 in accordance with one embodiment, BL1 2461 and BL2 2462 are biased to allow electrons to flow from BL2 2461 to BL1 2461. Each of GL1 2441, SG1 2401, and GL2 2442 is biased to allow carriers to flow through the channel regions of memory cell 2411. All other select gate lines and control gate lines (e.g., GL3 2443, SG2 2402, etc.) are at approximately 0 volts, and BL3 2463 and BL4 2464 are allowed to electrically float. In another embodiment, BL3 2463 and BL4 2464 can be at substantially 0 volts. Referring to FIG. 30, the channel region of the memory cell 2411 allows electrons to flow between BL2 2462 and BL1 2461. The channel region of the memory cell 2411 is adjacent to GL1 2441, SG1 2401, and GL2 2442 and between doped regions 114 and 116 GL1 2441, SG1 2401, and GL1 2442 are biased to allow electrons to flow from the doped region 116 to the doped region 114. The electrical field generated in the channel region of the memory cell 2411 near the doped region 114 (via BL1 2461) and GL1 2441 is sufficient to generate hot carriers within the channel region of memory cell 2411 near doped region 114. At least some of the hot carriers are attracted to the discontinuous storage elements at the charge storage region 24111 near the, junction formed near the doped region 114 within the substrate 12.

The charge storage region 24112 within the memory cell 2411 is not programmed because GL1 2441 and GL2 2442 are at substantially similar voltages, and SG1 2401 is at a significantly higher voltage. Memory cells 2412, 2413, 2414, and 2421 to 2424 are not programmed because the voltages on the other select gate lines and control gate lines are zero, and because BL3 2463 and BL4 2464 are electrically float or are at substantially the same voltage so that no current flows between those bit lines.

On a relative basis and when the substrate 12 (or associated well region therein) is biased to zero volts, when programming charge storage region 24111, the voltage differences between GL1 2441 and BL2 2462, between SG1 2401 and BL2 2462 between SLG2 2442 and BL2 2462 are in a range of approximately one to two times higher than the voltage difference between BL1 2461 and BL2 2462. In a particular embodiment, the voltage difference between GL1 2441 and BL2 2462 is greater than approximately 1.5 times the voltage difference between BL1 2461 and BL2 2462, and the voltage differences between SG1 2401 and BL2 2462 and between GL2 2442 and BL2 2462 are less than approximately 1.5 times the voltage difference between BL1 2461 and BL2 2462. In this embodiment, the programming mechanism for charge storage region 24111 is HCI.

In another embodiment, not illustrated, the charge storage region 24111 can be programmed using Fowler-Nordheim tunneling. Programming the charge storage region 24111 can be accomplished by creating a potential difference in a range of about 12 to 24 volts between BL1 2461 and GL1 2441. In one embodiment, erasing can be performed by biasing BL1 2461 to approximately +7 volts, setting the GL1 2441 to approximately −7 volts, and allowing the bit lines to electrically float. Note that the voltages used for BL1 2461 and GL1 2441 do not need to be symmetric with respect to 0 volts. For example, a combination of +5 volts and −9 volts can be used. After reading this specification, skilled artisans will be able to determine a set of voltages to be used for Fowler-Nordheim tunneling that meets their needs or desires.

Charge storage region 24112 can be programmed using the voltages as listed in FIGS. 31 and 32. As compared to charge storage region 24111, the voltage on SG1 2401 is reduced. The relative comparisons of the voltages described with respect to charge storage region 24111 are the same except that the voltage difference between SG1 2401 and BL2 2462 is approximately 0.24 to 0.5 times the voltage difference between GL1 2441 and BL2 2462. In this embodiment, the programming mechanism for charge storage region 24112 is SSI.

The programming of charge storage regions 24113 and 24114 are similar to charge storage regions 24112 and 24111, respectively, except that the voltages on GL1 2441 and GL2 2442 are reverses, and the voltages on BL1 2461 and BL2 2462 are reversed.

Regarding the other charge storage regions and memory cells, all charge storage regions for all the memory cells within the NVM array 18 are programmed using SSI. All other charge storage regions for memory cells 2412 to 2414 and 2421 to 2424 are similar to memory cell 2411. Each memory cell in FIG. 29 can store up to two bits of data.

Erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the control gate lines to approximately +7 volts, and allowing the bit lines to electrically float. Note that the voltages used for substrate 12 and the control gate lines do not need to be symmetric with respect to 0 volts. For example, a combination of −5 volts and +9 volts can be used. After reading this specification, skilled artisans will be able to determine a set of voltages to be used for erasing that meets their needs or desires.

The reading of data within NVM array 18 for memory cells 2411 to 2414 and 2421 to 2424 is given in FIGS. 31 and 32. When reading datum at charge storage region 24111 of memory cell 2411, BL1 2461 and BL2 2462 are biased so that electrons flow from BL2 2462 to 13L1 2461. SG1 2401 and GL2 2442 are biased to substantially similar voltages, and GL1 2441 is biased to a significantly lower voltage. In one particular embodiment, the voltage difference between GL1 2441 and BL2 2462 is approximately 0.33 to 0.67 times the voltage difference between SG1 2401 and BL2 2462 or GL2 2442 and BL2 2462. A sense amplifier (not illustrated) coupled to the BL1 2461 or BL2 2462 will detect a higher level of current when the charge storage region 24111 is not programmed compared to when the charge storage region 24111 is programmed.

As compared to reading datum at charge storage region 24111, when reading datum at charge storage region 24112, the voltages on GL1 2441 and GL2 2442 are reversed, and the voltages on BL1 2461 and BL2 2462 are increased. In a particular embodiment, the voltages on BL1 2461 and BL2 2462 are increased by approximately 1 volt. In one particular embodiment, the voltage differences between GL1 2441 and BL2 2462, between SG1 2401 and BL2 2462, and between GL2 2442 and BL2 2462 are approximately 2 to 6 times the voltage difference between BL1 2461 and BL2 2462. A sense amplifier (not illustrated) coupled to the BL1 2461 or BL2 2462 will detect a higher level of current when the charge storage region 24112 is not programmed compared to when the charge storage region 24112 is programmed. The reading of data at other charge storage regions with memory cells 2411, 2412 to 2414, and 2421 to 2424 can be performed in a similar manner.

The processes and structures described allow memory cells or portions thereof to be formed with gate electrodes and doped regions adjacent to the gate electrodes that have dimensions smaller than the resolution limits of lithographic processes. Also, a set of gate electrodes is formed within and outside of each trench. More specifically, the gate electrodes 52, 92, and 94 are in the form of spacers, and the doped regions 116 (FIG. 13) or the doped regions 146 (see FIG. 16) are adjacent to the gate electrodes 94. Depending on the particular embodiment, the gate electrodes 52 act as control gate electrodes or select gate electrodes, and the gate electrodes 92 and 94 act as select gate electrodes or control/select gate electrodes. The gate electrodes 52, 92, and 94 assist in generating a proper electrical field for SSI or HCI programming. The embodiments can be used to form three-transistor memory cells, which can allow for lower leakage current when the transistor is not being used (e.g., other memory cells being programmed or read, or the NVM array 18 is idling). Other embodiments described herein allow for an electronic device having a contactless array.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including a trench having a bottom and a first wall, a first gate electrode within the trench and adjacent to the first wall and overlying the bottom of the trench, a second gate electrode overlying the substrate outside of the trench, a third gate electrode within the trench and adjacent to the first gate electrode and overlying the bottom of the trench, and discontinuous storage elements including a first set of discontinuous storage elements, wherein the first set of the discontinuous storage elements lies adjacent to the first wall of the trench.

In one embodiment of the first aspect, the electronic device further includes a first source/drain region and a second source/drain region, wherein the first source/drain region lies within the substrate below the bottom of the trench and adjacent to the third gate electrode, and the second source/drain region lies within the substrate outside of the trench and adjacent to the second gate electrode. In a particular embodiment, the first gate electrode, the second gate electrode, the third gate electrode, the first set of discontinuous storage elements, the first source/drain region, and the second source/drain region are parts of a first memory cell.

In a more particular embodiment of the first aspect, the electronic device further includes a fourth gate electrode within the trench and adjacent to a second wall of the trench and overlying the bottom of the trench, a fifth gate electrode overlying the substrate outside of the trench, a sixth gate electrode within the trench and adjacent to the fourth gate electrode and overlying the bottom of the trench, and a third source/drain region lying within the substrate outside of the trench and adjacent to the fifth gate electrode. In this embodiment, the discontinuous storage elements includes a second set of discontinuous storage elements, wherein the second set of the discontinuous storage elements lies adjacent to the second wall of the trench, and the fourth gate electrode, the fifth gate electrode, the sixth gate electrode, the second set of discontinuous storage elements, the second source/drain region, and the third source/drain region are parts of a second memory cell. In an even more particular embodiment, each of the first memory cell and the second memory cell is operable to store 2 bits of data.

In another particular embodiment of the first aspect, the first set of discontinuous storage elements lies between the first gate electrode and the first wall. In another embodiment, each of the first gate electrode, the second gate electrode, and third gate electrode has an arc-shaped edge. In a particular embodiment, the third gate electrode includes a base, and the first set of the discontinuous storage elements also underlies the base of the third gate electrode.

In a further embodiment of the first aspect, the discontinuous storage elements includes a second set of discontinuous storage elements, the first set of discontinuous storage elements lies between the second gate electrode and the substrate, and the second set of discontinuous storage elements lies between the third gate electrode and the bottom of the trench. In a particular embodiment, the first gate electrode, the second gate electrode, the third gate electrode, the first set of discontinuous storage elements, and the second set of discontinuous storage elements are parts of a memory cell operable to store 4 bits of data.

In a second aspect, a process of forming an electronic device can include providing a substrate having a primary surface, forming a patterned sacrificial layer over the primary surface of the substrate, forming a trench extending from the primary surface of the substrate, wherein the trench has a first wall and a bottom, and forming discontinuous storage elements over the primary surface and within the trench. The process can also include forming a first gate electrode within the trench and adjacent to the first wall and overlying the bottom of the trench, wherein a portion of the first gate electrode lies at an elevation higher than the primary surface and adjacent to the patterned sacrificial layer, and removing the patterned sacrificial layer after forming the first gate electrode. The process can further include forming a second gate electrode outside the trench and adjacent to the first gate electrode, wherein forming the second gate electrode is performed after removing the patterned sacrificial layer, and removing a portion of the discontinuous storage elements to form a first set of discontinuous storage elements, wherein the first set of the discontinuous storage elements lies adjacent to the first wall of the trench.

In one embodiment of the second aspect, the process further includes forming a third gate electrode within the trench and adjacent to the first gate electrode and overlying the bottom of the trench. In a particular embodiment, forming the first gate electrode includes forming a first gate material over the substrate outside the trench and adjacent to the first wall and the bottom of the trench, wherein forming the first gate material only partly fills the trench, and anisotropically etching the first gate material to form the first gate electrode. In a more particular embodiment, forming the second gate electrode and forming the third gate electrode includes forming a second gate material over the substrate outside the trench and adjacent to the first wall and the bottom of the trench, wherein forming the second gate material is performed after forming the first gate electrode, and anisotropically etching the second gate material to form the second gate electrode and the third gate electrode.

In an even more particular embodiment of the second aspect, the process further includes forming a fourth gate electrode within the trench and adjacent to a second wall of the trench and overlying the bottom of the trench, wherein forming the first gate electrode and forming the fourth gate electrode are performed substantially simultaneously. The process still further includes forming a fifth gate electrode outside the trench and adjacent to the fourth gate electrode, forming a sixth gate electrode within the trench and adjacent to the fourth gate electrode and overlying the bottom of the trench, wherein forming the second gate electrode, forming the third gate electrode, forming the fifth gate electrode, and forming the sixth gate electrode are performed substantially simultaneously. The process yet further includes forming a first source/drain region, a second source/drain region, and a third source drain region. In this embodiment, the first source/drain region lies outside the trench and adjacent to the second gate electrode, the second source/drain region lies within the substrate beneath the bottom of the trench and adjacent to the third gate electrode and the sixth gate electrode, and the third source/drain region lies outside the trench and adjacent to the fifth gate electrode.

In another embodiment of the second aspect, forming the discontinuous storage elements is performed before forming the first gate electrode, and removing the portion of the discontinuous storage elements is performed after forming the first gate electrode and before forming the second gate electrode. In still another embodiment, forming the discontinuous storage elements is performed after forming the first gate electrode and before forming the second gate electrode, and removing the portion of the discontinuous storage elements is performed after forming the second gate electrode, wherein removing the portion also forms a second set of discontinuous storage elements, wherein the first set of discontinuous storage elements lies between the second gate electrode and the substrate.

In a third aspect, a process of using an electronic device can include providing a memory cell. The memory cell can include a substrate including a trench having a bottom and a first wall, a first gate electrode within the trench and adjacent to the first wall and overlying the bottom of the trench, a second gate electrode overlying the substrate outside of the trench, and a third gate electrode within the trench and adjacent to the first gate electrode and overlying the bottom of the trench. The memory cell can further include a first source/drain region adjacent to the third gate electrode and coupled to a first bit line, a second source/drain region adjacent to the second gate electrode and coupled to a second bit line, and discontinuous storage elements including a first set of discontinuous storage elements, wherein the first set of the discontinuous storage elements lies adjacent to the first wall of the trench. The process can also include programming a first bit of the memory cell including biasing the first bit line and the second bit line at a first voltage difference, biasing the third gate electrode, such that a second voltage difference between the third gate electrode and the first bit line is no greater than approximately half of the first voltage difference, biasing the first gate electrode, such that a third voltage difference between the first gate electrode and the first bit line is in a range of approximately 0.5 to approximately 1.5 times the first voltage difference, and biasing the second gate electrode, such that a fourth voltage difference between the second gate electrode and the first bit line is in a range of approximately 0.5 to approximately 1.5 times the first voltage difference.

In one embodiment of the third aspect, the process further includes programming a second bit of the memory cell including biasing the first bit line and the second bit line at a fifth voltage difference, biasing the second gate electrode, such that a sixth voltage difference between the second gate electrode and the second bit line is no greater than approximately half of the fifth voltage difference, biasing the first gate electrode, such that a seventh voltage difference between the first gate electrode and the second bit line is in a range of approximately 0.5 to approximately 1.5 times the fifth voltage difference, and biasing the third gate electrode, such that an eighth voltage difference between the third gate electrode and the second bit line is in a range of approximately 0.5 to approximately 1.5 times the fifth voltage difference.

In another embodiment of the third aspect, the process further includes erasing the memory cell including biasing the substrate and the first gate electrode at a fourth voltage difference, such that the fourth voltage difference has an opposite polarity compared to first voltage difference, and the fourth voltage difference has a magnitude that is at least approximately 4 times a magnitude of the first voltage difference, and electrically floating the first bit line and the second bit line.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
    a substrate having a primary surface and including a trench having a bottom and a first wall;
    a first gate electrode within the trench and adjacent to the first wall and overlying the bottom of the trench, wherein the first gate electrode includes a portion that extends to an elevation higher than an elevation of the primary surface of the substrate;
    a second gate electrode overlying the substrate outside of the trench;
    a third gate electrode within the trench and adjacent to the first gate electrode and overlying the bottom of the trench; and
    discontinuous storage elements including a first set of discontinuous storage elements, wherein the first set of the discontinuous storage elements lies adjacent to the first wall of the trench, and wherein the first set of the discontinuous storage elements include silicon nanocrystals or metal nanoclusters.

2. The electronic device of claim 1, further comprising a first source/drain region and a second source/drain region, wherein:
    the first source/drain region lies within the substrate below the bottom of the trench and adjacent to the third gate electrode; and
    the second source/drain region lies within the substrate outside of the trench and adjacent to the second gate electrode.

3. The electronic device of claim 2, wherein the first gate electrode, the second gate electrode, the third gate electrode, the first set of discontinuous storage elements, the first source/drain region, and the second source/drain region are parts of a first memory cell.

4. The electronic device of claim 3, wherein the first gate electrode lies between the first wall of the trench and the third gate electrode.

5. The electronic device of claim 4, wherein the first set of discontinuous storage elements lie between the first wall of the trench and the first gate electrode.

6. The electronic device of claim 3, further comprising:
    a fourth gate electrode within the trench and adjacent to a second wall of the trench and overlying the bottom of the trench;
    a fifth gate electrode overlying the substrate outside of the trench;

a sixth gate electrode within the trench and adjacent to the fourth gate electrode and overlying the bottom of the trench; and a third source/drain region lying within the substrate outside of the trench and adjacent to the fifth gate electrode, wherein:

the discontinuous storage elements includes a second set of discontinuous storage elements, wherein the second set of the discontinuous storage elements lies adjacent to the second wall of the trench; and the fourth gate electrode, the fifth gate electrode, the sixth gate electrode, the second set of discontinuous storage elements, the second source/drain region, and the third source/drain region are parts of a second memory cell.

7. The electronic device of claim 6, wherein each of the first memory cell and the second memory cell is operable to store 2 bits of data.

8. The electronic device of claim 2, wherein:

the first set of discontinuous storage elements lies between the first gate electrode and the first wall;

no discontinuous storage element lies between the second gate electrode and the primary surface of the substrate;

the third gate electrode has a base substantially parallel to the bottom of the trench; and no discontinuous storage element lies between the base of the third gate electrode and the bottom of the trench.

9. The electronic device of claim 1, wherein each of the first gate electrode, the second gate electrode, and third gate electrode has an arc-shaped edge.

10. The electronic device of claim 9, wherein the second gate electrode comprises a base, and the first set of the discontinuous storage elements underlies the base of the second gate electrode.

11. An electronic device comprising:

a substrate having primary surface and including a trench having a bottom and a first wall;

a first gate electrode within the trench and adjacent to the first wall and overlying the bottom of the trench, wherein the first gate electrode includes a portion that extends to an elevation higher than an elevation of the primary surface of the substrate;

a second gate electrode overlying the substrate outside of the trench;

a third gate electrode within the trench and adjacent to the first gate electrode and overlying the bottom of the trench; and discontinuous storage elements including a first set and a second set of discontinuous storage elements, wherein:

within a first memory cell, the discontinuous storage elements include individual discontinuous storage elements that are substantially physically separated from each other;

the first set of discontinuous storage elements lies between the second gate electrode and the substrate; and the second set of discontinuous storage elements lies between the third gate electrode and the bottom of the trench.

12. The electronic device of claim 11, further comprising a first source/drain region and a second source/drain region, wherein:

the first source/drain region lies within the substrate below the bottom of the trench and adjacent to the third gate electrode; and the second source/drain region lies within the substrate outside of the trench and adjacent to the second gate electrode.

13. The electronic device of claim 12, wherein the first gate electrode, the second gate electrode, the third gate electrode, the first and second sets of discontinuous storage elements, the first source/drain region, and the second source/drain region are parts of the first memory cell.

14. The electronic device of claim 13, further comprising a second memory cell, wherein each of the first memory cell and the second memory cell is operable to store 2 bits of data.

15. The electronic device of claim 13, further comprising:

a fourth gate electrode within the trench and adjacent to a second wall of the trench and overlying the bottom of the trench;

a fifth gate electrode overlying the substrate outside of the trench;

a sixth gate electrode within the trench and adjacent to the fourth gate electrode and overlying the bottom of the trench; and a third source/drain region lying within the substrate outside of the trench and adjacent to the fifth gate electrode, wherein:

the discontinuous storage elements includes a third set of discontinuous storage elements, wherein the third set of the discontinuous storage elements lies adjacent to the second wall of the trench; and the fourth gate electrode, the fifth gate electrode, the sixth gate electrode, the third set of discontinuous storage elements, the second source/drain region, and the third source/drain region are parts of a second memory cell.

16. The electronic device of claim 13, wherein the third gate electrode comprises a base, and the first set of the discontinuous storage elements also underlies the base of the third gate electrode.

17. The electronic device of claim 13, wherein the first gate electrode, the second gate electrode, the third gate electrode, the first and second sets of discontinuous storage elements are parts of a memory cell operable to store 4 bits of data.

18. The electronic device of claim 13, wherein the first gate electrode lies between the first wall of the trench and the third gate electrode.

19. The electronic device of claim 18, wherein substantially no discontinuous storage elements lie between the first wall of the trench and the first gate electrode.

20. An electronic device comprising:

a substrate including a trench having a bottom and a first wall;

a first gate electrode within the trench and adjacent to the first wall and overlying the bottom of the trench:

a second gate electrode overlying the substrate outside of the trench;

a third gate electrode within the trench and adjacent to the first gate electrode and overlying the bottom of the trench;

a first source/drain region lying within the substrate below the bottom of the trench and adjacent to the third gate electrode; and a second source/drain region lying within the substrate outside of the trench and adjacent to the second gate electrode; and discontinuous storage elements including a first set and a second set of discontinuous storage elements, wherein:

the first set of discontinuous storage elements lies between the second gate electrode and the substrate;

the second set of discontinuous storage elements lies between the third gate electrode and the bottom of the trench;

the first gate electrode, the second gate electrode, the third gate electrode the first and second sets of discontinuous storage elements, the first source/drain region and the second ion are arts of a first memory cell; and each of the first gate electrode, the second gate electrode, and third gate electrode has an arc-shaped edge.

* * * * *

UNITED STATES PATENT AND TRADEMARK OFFICE
CERTIFICATE OF CORRECTION

PATENT NO.         : 7,838,922 B2
APPLICATION NO.    : 11/626753
DATED              : November 23, 2010
INVENTOR(S)        : Chi-Nan Li and Min Hong Page 1 of 1

It is certified that error appears in the above-identified patent and that said Letters Patent is hereby corrected as shown below:

Column 28, Line 1, please change "region and the second ion are arts" to --region, and the second source/drain region are parts--

Signed and Sealed this
Eighteenth Day of October, 2011

David J. Kappos
*Director of the United States Patent and Trademark Office*